(12) United States Patent
Shichi et al.

(10) Patent No.: US 10,366,858 B2
(45) Date of Patent: Jul. 30, 2019

(54) ION BEAM DEVICE

(71) Applicant: Hitachi High-Technologies Corporation, Minato-ku, Tokyo (JP)

(72) Inventors: Hiroyasu Shichi, Tokyo (JP); Shinichi Matsubara, Tokyo (JP); Yoshimi Kawanami, Tokyo (JP); Hiroyuki Muto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/514,735

(22) PCT Filed: Sep. 30, 2015

(86) PCT No.: PCT/JP2015/077780
§ 371 (c)(1),
(2) Date: Jul. 18, 2017

(87) PCT Pub. No.: WO2016/056446
PCT Pub. Date: Apr. 14, 2016

(65) Prior Publication Data
US 2017/0352517 A1 Dec. 7, 2017

(30) Foreign Application Priority Data
Oct. 8, 2014 (JP) .................................. 2014-207229

(51) Int. Cl.
*H01J 27/26* (2006.01)
*H01J 37/08* (2006.01)
(Continued)

(52) U.S. Cl.
CPC .............. *H01J 27/26* (2013.01); *H01J 37/08* (2013.01); *H01J 37/18* (2013.01); *H01J 37/28* (2013.01);
(Continued)

(58) Field of Classification Search
CPC ......... H01J 2237/006; H01J 2237/0807; H01J 27/26; H01J 37/3056; H01J 37/18; H01J 37/08; H01J 37/28; C23C 14/3442
See application file for complete search history.

(56) References Cited

U.S. PATENT DOCUMENTS 8,460,842 B2 *  6/2013  Ogawa ...................... G03F 1/24
                                                       250/309
8,764,994 B2 *  7/2014  Sugiyama ................. H01J 9/02
                                                        216/11
(Continued)

FOREIGN PATENT DOCUMENTS

JP   2008-153199 A   7/2008
JP   2008-270039 A   11/2008
(Continued)

OTHER PUBLICATIONS

Schröder, Volkmar, and Kai Holtappels. "Explosion characteristics of hydrogen-air and hydrogen-oxygen mixtures at elevated pressures." International Conference on hydrogen safety, Congress Palace, Pisa, Italy. 2005 (Year: 2005).*
(Continued)

*Primary Examiner* — Wyatt A Stoffa
(74) *Attorney, Agent, or Firm* — Crowell & Moring LLP

(57) ABSTRACT

In order to provide an ion beam apparatus excellent in safety and stability even when a sample is irradiated with hydrogen ions, the ion beam apparatus includes a vacuum chamber, a gas field ion source that is installed in the vacuum chamber and has an emitter tip, and gas supply means for supplying a gas to the emitter tip. The gas supply means includes a mixed gas chamber that is filled with a hydrogen gas and a gas for diluting the hydrogen gas below an explosive lower limit.

13 Claims, 7 Drawing Sheets

(51) Int. Cl.
*H01J 37/18* (2006.01)
*H01J 37/28* (2006.01)

(52) U.S. Cl.
CPC . *H01J 2237/006* (2013.01); *H01J 2237/0807* (2013.01)

(56) References Cited

U.S. PATENT DOCUMENTS

| | | | | |
|---|---|---|---|---|
| 9,754,786 | B2* | 9/2017 | Kaim | H01J 37/08 |
| 2008/0142702 | A1* | 6/2008 | Frosien | H01J 27/26 250/288 |
| 2008/0237496 | A1* | 10/2008 | Gupta | H01J 37/08 250/492.21 |
| 2009/0200484 | A1 | 8/2009 | Frosien | |
| 2009/0230299 | A1* | 9/2009 | Shichi | H01J 27/10 250/282 |
| 2010/0108902 | A1* | 5/2010 | Frosien | H01J 37/08 250/396 R |
| 2010/0178601 | A1* | 7/2010 | Takaoka | G03F 1/74 430/5 |
| 2012/0119113 | A1* | 5/2012 | Colvin | H01J 37/08 250/492.3 |
| 2012/0328974 | A1* | 12/2012 | Takaoka | G03F 1/74 430/5 |
| 2013/0126731 | A1* | 5/2013 | Shichi | H01J 37/08 250/310 |
| 2014/0197329 | A1* | 7/2014 | Muto | H01J 37/08 250/396 R |

FOREIGN PATENT DOCUMENTS

| | | |
|---|---|---|
| JP | 2009-187950 A | 8/2009 |
| JP | 2013-213747 A | 10/2013 |
| JP | 2014-191864 A | 10/2014 |
| WO | WO 2011/096227 A1 | 8/2011 |

OTHER PUBLICATIONS

International Search Report (PCT/ISA/210) issued in PCT Application No. P PCT/JP2015/077780 dated Dec. 22, 2015 with English translation (6 pages).

Japanese-language Written Opinion (PCT/ISA/237) issued in PCT Application No. PCT/JP2015/077780 dated Dec. 22, 2015 (4 pages).

* cited by examiner

ION BEAM DEVICE

TECHNICAL FIELD

The present invention relates to an ion beam apparatus.

BACKGROUND ART

A sample is irradiated with an electron beam while being scanned therewith to detect secondary electrons emitted from the sample, thereby being capable of observing a structure of a sample surface. This is called a scanning electron microscope (hereinafter abbreviated as "SEM"). On the other hand, even when the sample is irradiated with the ion beam while being scanned therewith to detect charged particles such as the secondary electrons, secondary ions, or reflected ions emitted from the sample, the structure of the sample surface can be observed. This is called a canning ion microscope (hereinafter abbreviated as "SIM").

The ion beam has a characteristic of being sensitive to information on the sample surface as compared with the electron beam. This is because an excitation area of the secondary electrons is localized on the sample surface more than the irradiation of the electron beam. In the electron beam, aberration is generated due to a diffraction effect because a property as waves of the electrons cannot be ignored. On the other hand, because the ion beam is heavier than the electrons, the aberration caused by the diffraction effect is extremely small as compared with the electrons. In particular, when a gas field ion source with high luminance is used, the ion beam can be focused extremely finely as compared with the electron beam. In other words, ultrahigh resolution of the sample surface is enabled.

Meanwhile, the gas field ion source is supplied with a gas such as helium to a metal emitter tip having a tip curvature radius of about 100 nm, and a high voltage of several kV or more is applied to the emitter tip, to thereby field ionize gas molecules, and draw the ionized gas as an ion beam. The feature of the ion source resides in that an extremely fine ion beam can be generated because an ion energy width is narrow and a size of an ion generation source is small. In addition, in order to increase an ion radiation angle current density of the gas field ion source, the emitter tip is cooled to an extremely low temperature and a pressure of the ionized gas around the emitter tip is set to, for example, about $10^{-2}$ to several Pa.

Further, when a miniaturized semiconductor sample is irradiated with the extremely fine ion beam so as to be scanned therewith to detect the detected secondary electrons, a dimension of the surface structure of the semiconductor sample can be detected with high accuracy. Further, when a membrane sample is irradiated with the extremely fine ion beam and ions that have been transmitted through the sample are detected, information reflecting an internal structure of the sample can be obtained.

Patent Literature 1 discloses a charged particle microscope including a vacuum chamber, a first pump that exhausts a gas in the vacuum chamber, an emitter tip that is disposed in the vacuum chamber, an extraction electrode that is disposed to face the emitter tip, and gas supply means that supplies the gas to the emitter tip. In the charged particle microscope, the ionized gas supply means includes a second pump that circulates the gas that has not been used in the emitter tip, and the second pump contains a gas adsorbing material that adsorbs the ionized gas.

In addition, Patent Literature 2 discloses the use of hydrogen or helium in a gas field ion source, and the use of a mixed gas of hydrogen and helium or a mixed gas with other gases.

CITATION LIST

[Patent Literature 1] International Publication No. 2011/096227

[Patent Literature 2] Japanese Unexamined Patent Application Publication No. 2013-213747

SUMMARY OF INVENTION

Technical Problem

The characteristic of the gas field ion source resides in the use of ions emitted from the vicinity of one atom at the tip of a nano pyramid. In other words, an area where ions are emitted is narrow and an ion light source is small to nanometer or less. For that reason, a current per unit area and unit solid angle, that is, brightness is high. When the ions are focused on the sample from the ion light source at the same magnification or the ions are focused on the sample with a reduction ratio on the order of a fraction, a beam diameter of, for example, about 0.1 nm to 1 nm is obtained. In other words, super resolution observation of about 0.1 nm to 1 nm is realized.

Also, in order to observe the sample with a high signal-to-noise ratio, there is a need to obtain an ion beam with a large current density on the sample. For that purpose, there is a need to increase an ion emission angle current density of the gas field ion source. In order to increase the ion radiation angle current density, a molecular density of an ion material gas (hereinafter referred to as ionized gas) in the vicinity of the emitter tip may be increased. The gas molecular density per unit pressure is inversely proportional to a gas temperature. For that reason, the emitter tip may be cooled to an extremely low temperature and the temperature of the gas around the emitter tip may be reduced. This makes it possible to increase the molecular density of the ionized gas in the vicinity of the emitter tip. The pressure of the ionized gas around the emitter tip can be set to, for example, about $10^{-2}$ to 10 Pa.

In general, if hydrogen is used instead of helium as the ionized gas, a damage to the sample is reduced, which is advantageous for observation and dimensional measurement. In addition, hydrogen is suitable for low damage processing depending on the sample. Further, since a rate at which hydrogen is transmitted through the sample is high, hydrogen is also suitable for observation inside the sample. Also, if ions of elements heavy in mass such as neon, oxygen, nitrogen, argon, krypton, or xenon are used instead of helium as the ionized gas, the sputtering effect becomes large. Therefore, the use of the ions heavy in mass is suitable for processing the sample. In addition, the sample is irradiated with the beams of two or more kinds of different ion species, and the intensities of the secondary particles or transmitted ions obtained by irradiation of the respective ion beams is compared with each other or calculated, as a result of which it is expected to obtain more detailed information on the sample surface or sample interior.

However, the gas field ion source having a nano pyramidal structure at the tip of a metal emitter suffers from the following problem: that is, although, an ion beam apparatus with ion species of helium alone has been put to practical application, an apparatus which can obtain diverse effects with the use of two or more kinds of gas pieces has not been put into practical application. Up to now, in the apparatus equipped with two kinds of gas chambers, furthermore, the ion emission has been experimentally confirmed for the gas species other than helium and neon. However, such an apparatus does not necessarily reach a practical level of reliability, stability, and so on. In particular, in the case of the hydrogen gas, even if the hydrogen gas is merely introduced into the gas field ion source introducing the helium gas as in the conventional art, the operation of the practical level is not guaranteed. In addition, safety measures when hydrogen gas is used are not considered.

An object or the present invention is to provide an ion beam apparatus excellent in safety and stability even when a sample is irradiated with hydrogen ions.

Solution to Problem

According to an embodiment for solving the above object, there is provided an ion beam apparatus including: a vacuum chamber; a gas field ion source that is installed in the vacuum chamber and has an emitter tip; an extraction electrode that is disposed to face the emitter tip; gas supply means for supplying a gas to the emitter tip; a focusing lens that focuses an ion beam emitted from the emitter tip; a deflector that deflects the ion beam that has passed through the focusing lens; and a secondary particle detector that irradiates a sample with the ion beam to detect secondary particles emitted from the sample, in which the gas supply means includes a mixed gas chamber containing two or more types of gases including at least a hydrogen gas and a pipe that connects the vacuum chamber to the mixed gas chamber, and concentration of the hydrogen gas in the mixed gas chamber is equal to or lower than an explosive lower limit.

In addition, there is provided an ion beam apparatus including: a vacuum chamber; a gas field ion source that is installed in the vacuum chamber and has an emitter tip; an extraction electrode that is disposed to face the emitter tip; gas supply means for supplying a gas to the emitter tip; a focusing lens that focuses an ion beam emitted from the emitter tip; a deflector that deflects the ion beam that has passed through the focusing lens; and a secondary particle detector that irradiates a sample with the ion beam to detect secondary particles emitted from the sample, in which the gas supply means includes a mixed gas chamber that contains a hydrogen gas and an inert gas or a nitrogen gas which causes concentration of the hydrogen gas to be equal to or lower than an explosive lower limit, a hydrogen gas adsorbing material containing chamber that adsorbs the hydrogen gas, and a hydrogen gas pipe that supplies the hydrogen gas to the vicinity of the emitter tip.

Advantageous Effects of Invention

According to the present invention, an ion beam apparatus excellent in safety and a gas purification system used for the ion beam apparatus even when a sample is irradiated with hydrogen ions can be provided.

BRIEF DESCRIPTION OF DRAWINGS

FIGS. 4A-4C are cross-sectional views illustrating electrode spaces of an electrostatic lens in the ion beam apparatus according to the first embodiment of the present invention, in which FIG. 4A is a schematic configuration diagram of one electrostatic lens, FIG. 4B is a schematic configuration diagram of another electrostatic lens, and FIG. 4C is a detailed configuration diagram of the electrostatic lens.

DESCRIPTION OF EMBODIMENTS

Figure 1:
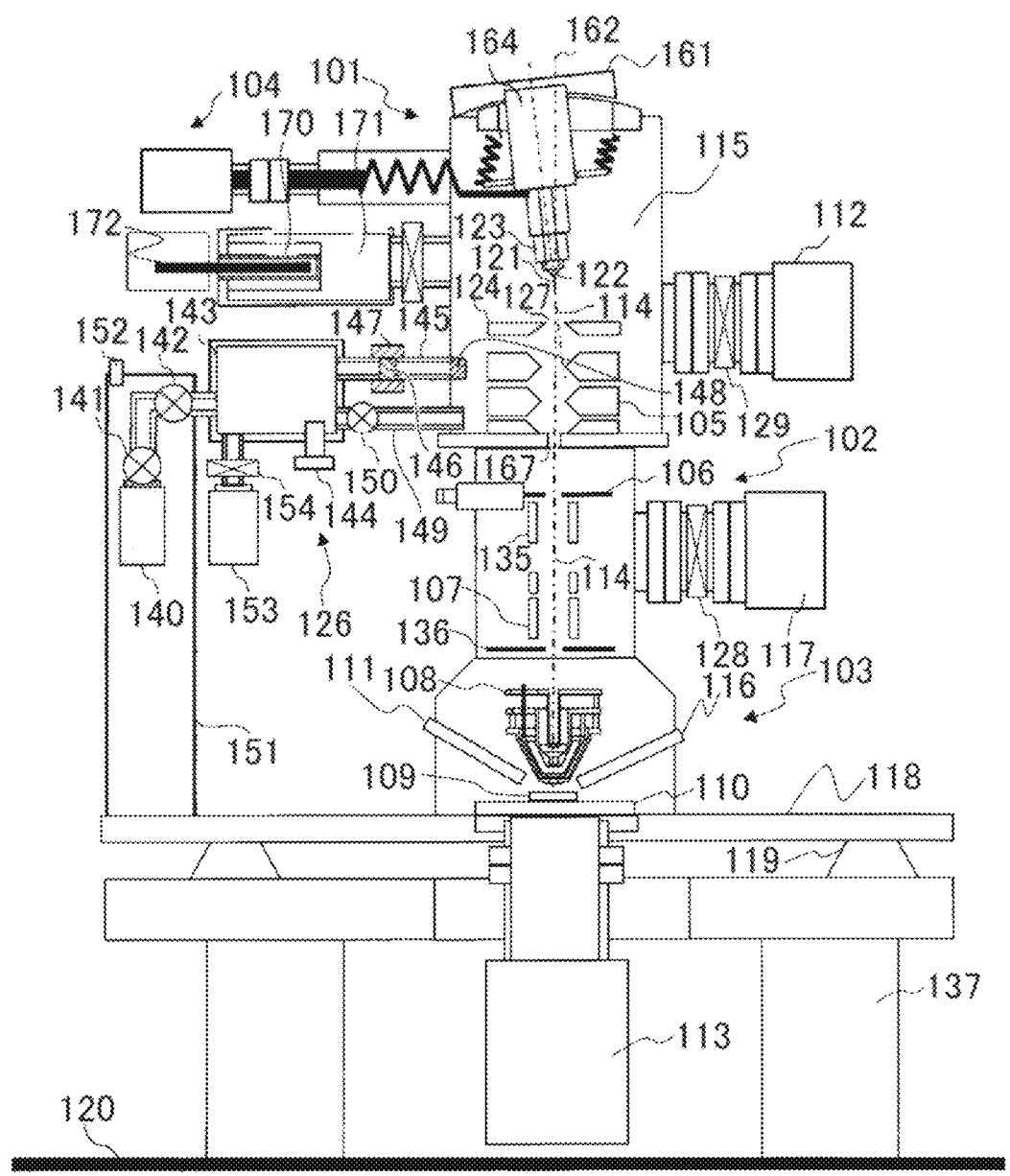
FIG. 1 is a schematic configuration diagram illustrating an example of an ion beam apparatus according to a first embodiment of the present invention.

The present inventors have studied various conditions for stabilizing a hydrogen ion beam while taking safety into consideration when a hydrogen gas is used. As a result, the present inventors have found that a hydrogen ion beam current is stabilized with the use of a hydrogen gas low in concentration (less than 50%), and both of safety and stability can be performed without any change in the stability of hydrogen ion beam current even if the hydrogen gas concentration is equal to or lower than an explosion limit. The present invention has been born by the novel knowledge.

Hereinafter, embodiments of the present invention will be described with reference to the drawings. The same reference numerals or symbols denote identical components.

First Embodiment

An example of an ion beam apparatus according to a first embodiment of the present invention will be described with reference to FIG. 1. Hereinafter, a first example of a scanning ion microscope apparatus will be described as the ion beam apparatus. A scanning ion microscope according to the present example includes a gas field ion source 101, an ion beam irradiation system column 102, a sample chamber 103, a cooling mechanism (refrigerator) 104, and a gas supply mechanism 126. In this example, the gas field ion source 101, the ion beam irradiation system column 102, and the sample chamber 103 configure a vacuum chamber.

The gas field ion source 101 includes a needle-shaped emitter tip 121, an extraction electrode 124 that is disposed so as to face the emitter tip and has an opening (hole) 127 through which ions pass, a filament 122 having a thin line shape, a columnar filament mount 123, and a columnar emitter base mount 164.

In addition, an ion source evacuation pump 112 for evacuating a vacuum chamber 115 in which the gas field ion source 101 is disposed is provided. A vacuum shutoff valve 129 is installed between the vacuum chamber 115 and the ion source evacuation pump 112.

Further, a vacuum chamber 171 containing a non-evaporable getter 170 is connected to the vacuum chamber 115 of the gas field ion source 101. In addition, a heating mechanism 172 is disposed outside of the vacuum chamber 171 in the non-evaporable getter. The heating mechanism 172 is based on a principle of resistance heating, lamp heating, or the like. Also, a vacuum shutoff valve 174 is disposed between the ion source evacuation pump 112 and the vacuum chamber 115, and the vacuum chamber 171 containing the non-evaporable getter 170 and the vacuum chamber 115. In addition, a vacuum pump 178 is connected to the vacuum chamber 171 containing the non-evaporable getter 170 through a vacuum shutoff valve 177.

Furthermore, the gas field ion source 101 includes a tilt mechanism 161 for changing a tilt of the emitter tip 121, which is fixed to the emitter base mount 164. The tilt mechanism 161 is used to match a direction of the tip of the emitter tip with an ion beam irradiation axis (optical axis) 162 with high precision. The adjustment of the angular axis has the effect of reducing a distortion of the ion beam.

In addition, the ion beam irradiation system includes a focusing lens 105 for focusing ions emitted from the gas field ion source 101, a movable first aperture 106 for limiting an ion beam 114 that has passed through the focusing lens 105 and a differential exhaust hole 167, a first deflector 135 for scanning or aligning the ion beam 114 that has passed through the first aperture 106, a second deflector 107 for deflecting the ion beam 114 that has passed through the first aperture 106, a second aperture 136 for limiting the ion beam 114 that has passed through the first aperture 106 and an objective lens 108 that is an electrostatic ion lens for focusing the ion beam that has passed through the second aperture 136 onto a sample 109. The objective lens 108 includes four electrodes.

In addition, an ion beam irradiation system column evacuation pump 117 for evacuating the vacuum chamber of the ion beam irradiation system column 102 is provided. A vacuum shutoff valve 128 is disposed between the vacuum chamber and the ion beam irradiation system column evacuation pump 117.

Further, a sample stage 110 on which the sample 109 is placed, a charged particle detector 111, and an electron gun 116 for neutralizing the charge-up of the sample when the sample is irradiated with the ion beam are disposed inside of the sample chamber 103. The ion microscope according to the present embodiment further includes a sample chamber evacuation pump 113 for evacuating the sample chamber 103. The sample chamber 103 is equipped with a gas gun not shown that supplies etching and deposition gases to the vicinity of the sample.

A base plate 116 is disposed on an apparatus stand 137 which is placed over a floor 120 through a vibration isolation mechanism 119. The gas field ion source 101, the ion beam irradiation system column 102, and the sample chamber 103 are supported by the base plate 118.

The cooling mechanism 104 cools the inside of the gas field ion source 101 and the emitter tip 121. When the cooling mechanism 104 is configured by, for example, a Gifford McMahon type (GM type) refrigerator or a pulse tube refrigerator, a compressor unit (compressor) using a helium gas as a working gas not shown is installed on the floor 120. A vibration of the compressor unit (compressor) is transmitted to the apparatus stand 137 through the floor 120. The vibration isolation mechanism 119 is disposed between the apparatus stand 137 and the base plate 118, which makes it difficult to transmit the high frequency vibration of the floor to the gas field ion source 101, the ion beam irradiation system column 102, the sample chamber 103, and so on. Therefore, it is difficult to transmit the vibration of the compressor unit (compressor) through the floor 120 to the gas field ion source 101, the ion beam irradiation system, and the sample chamber 103. In this description, the refrigerator (not shown) and the compressor were explained as the cause of the vibration of the floor 120. However, the cause of the vibration of the floor 120 is not limited to the above case.

In addition, the vibration isolation mechanism 119 may be configured by a vibration isolation rubber, a spring, a damper, or a combination of those components.

The gas supply mechanism 126 includes a mixed gas chamber 140, a mixed gas chamber valve 141, a gas fine adjustment valve 142, a gas reservoir 143, a gas pressure measuring unit 144, a first gas supply pipe 145, a hydrogen selective transmission membrane 146, a hydrogen selective transmission membrane heating mechanism 147, a hydrogen gas purifier 148, a second gas supply pipe 149, a second gas supply pipe valve 150, a mixed gas chamber cover 151, a hydrogen gas sensor 152, a gas reservoir exhaust pump 153, a gas reservoir exhaust pump valve 154 and the like.

In the present embodiment, a pyramidal structure of atoms on a nanometer order is formed at a tip of the emitter tip 121 of the gas field ion source 101. The pyramidal structure is called a nano pyramid. The nano pyramid typically includes one atom at the tip, a layer of three or six atoms below the one atom, and further a layer of ten or more atoms below the layer.

The emitter tip is formed of a tungsten or molybdenum thin wire, or the like. Also, a method of forming a nano pyramid at the tip of the emitter tip has been known, and there are a method in which after the emitter tip has been covered with iridium, platinum, rhenium, osmium, palladium, rhodium or the like, a filament is energized to heat the emitter tip at a high temperature, and other methods such as an in-vacuum field evaporation method, a gas etching method, an ion beam irradiation method, and a remodeling method. According to the methods described above, the nano pyramid of the atoms can be formed at the tip of the tungsten wire or the molybdenum wire. For example, in the case where the tip of the tungsten wire <111> is covered with iridium, the tip is formed of one or three tungsten atoms or atoms such as iridium. Apart from the above configuration, the same nano pyramid can be formed at the tip of a thin wire made of platinum, iridium, rhenium, osmium, palladium, rhodium or the like by etching or remodeling in a vacuum.

With the adjustment of an electric field intensity created at the tip of the emitter tip 121, ions can be generated in the vicinity of one atom at the tip of the emitter tip 121. Therefore, an area where ions are emitted, that is, an ion light source is an extremely narrow area and is equal to or less than nanometer. In this way, the ions are generated from a very limited area, thereby being capable of setting a beam diameter to 1 nm or less. For that reason, a current value per unit area and unit solid angle of the ion source is increased, which is an important characteristic for obtaining an ion beam of fine diameter and large current on the sample.

When the nano pyramid with one tip atom is made of platinum, rhenium, osmium, iridium, palladium, rhodium or the like, a current emitted from the unit area and unit solid angle, that is, ion source brightness can be increased likewise, which is suitable for reducing the beam diameter on the sample of the ion microscope and for increasing the current. However, when the emitter tip is sufficiently cooled and the gas supply is sufficient, the number of atoms at the tip is not necessarily limited to one, but satisfactory performance can be exhibited even when the number of atoms is 3, 6, 7, 10, or the like. In particular, in the case where the tip can be formed of atoms not less than four and less than ten, the ion source luminance can be increased, the tip atoms are hardly evaporated, and stable long life operation is enabled.

Figure 2:
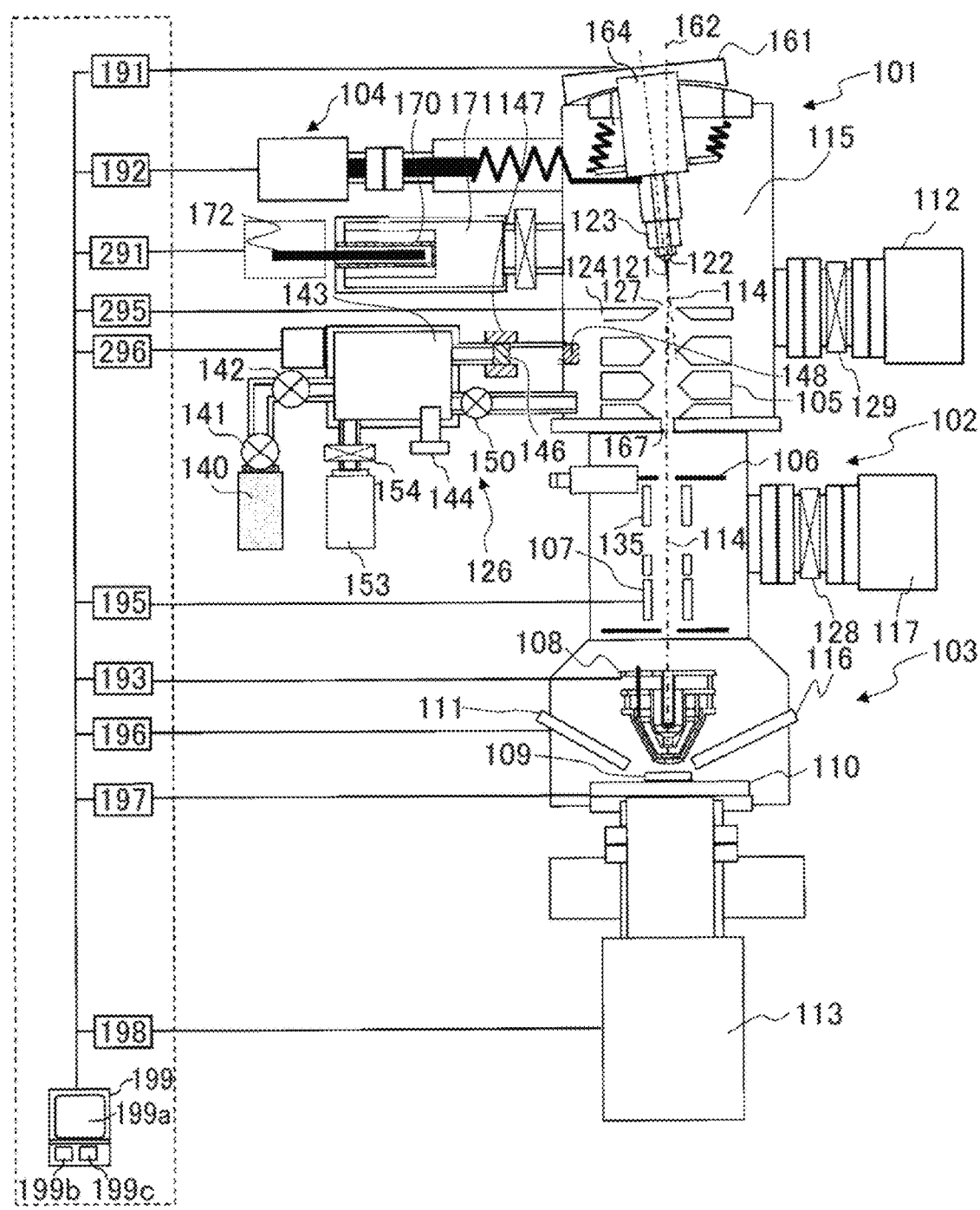
FIG. 2 is a schematic configuration diagram illustrating an example of a control system in the ion beam apparatus according to the first embodiment of the present invention.

FIG. 2 illustrates an example of a controller for the ion microscope according to the present embodiment illustrated in FIG. 1. The controller illustrated in the present embodiment includes a gas field ion source controller 191 for controlling the gas field ion source 101, a refrigerator controller 192 for controlling the refrigerator 104, a temperature controller 291 such as a heating mechanism and a cooling mechanism for a non-evaporable getter, an extraction electrode application voltage power supply 295, a hydrogen concentration controller 296, a lens controller 193 for controlling the focusing lens 105 and the objective lens 108, a first aperture controller (not shown) for controlling the movable first aperture 106, a first deflector controller (not shown) for controlling the first deflector 135, a second deflector controller 195 for controlling the second deflector 107, a sample stage controller 197 for controlling the sample stage 110, an evacuation pump controller 198 for controlling the sample chamber evacuation pump 113, a sample stage 110, a plurality of power supplies for applying a voltage to the electrodes or the like of the charged particle detector 111 and a controller 196 for those power supplies, and a main body controller 199 having a calculation processing capacity. The main body controller 199 includes an arithmetic processor 199b, a storage unit 199c, an image display unit 199a, and so on. The image display unit 199a displays an image generated from a detection signal of the charged particle detector 111 and information input by the input means.

The sample stage 110 has a mechanism for linearly moving the sample 109 in two orthogonal directions on a sample mounting surface, a mechanism for linearly moving the sample 109 in a direction perpendicular to the sample mounting surface, and a mechanism for moving the sample 109 on the sample mounting surface, and a mechanism for rotating the sample 109 on the sample mounting surface. The sample stage 110 further has a tilt function capable of varying an irradiation angle of the ion beam 111 to the sample 109 by rotating the sample 109 about a tilt axis. Those controls are executed by the sample stage controller 197 according to a command from a computing device (main body controller) 199.

Figure 3:
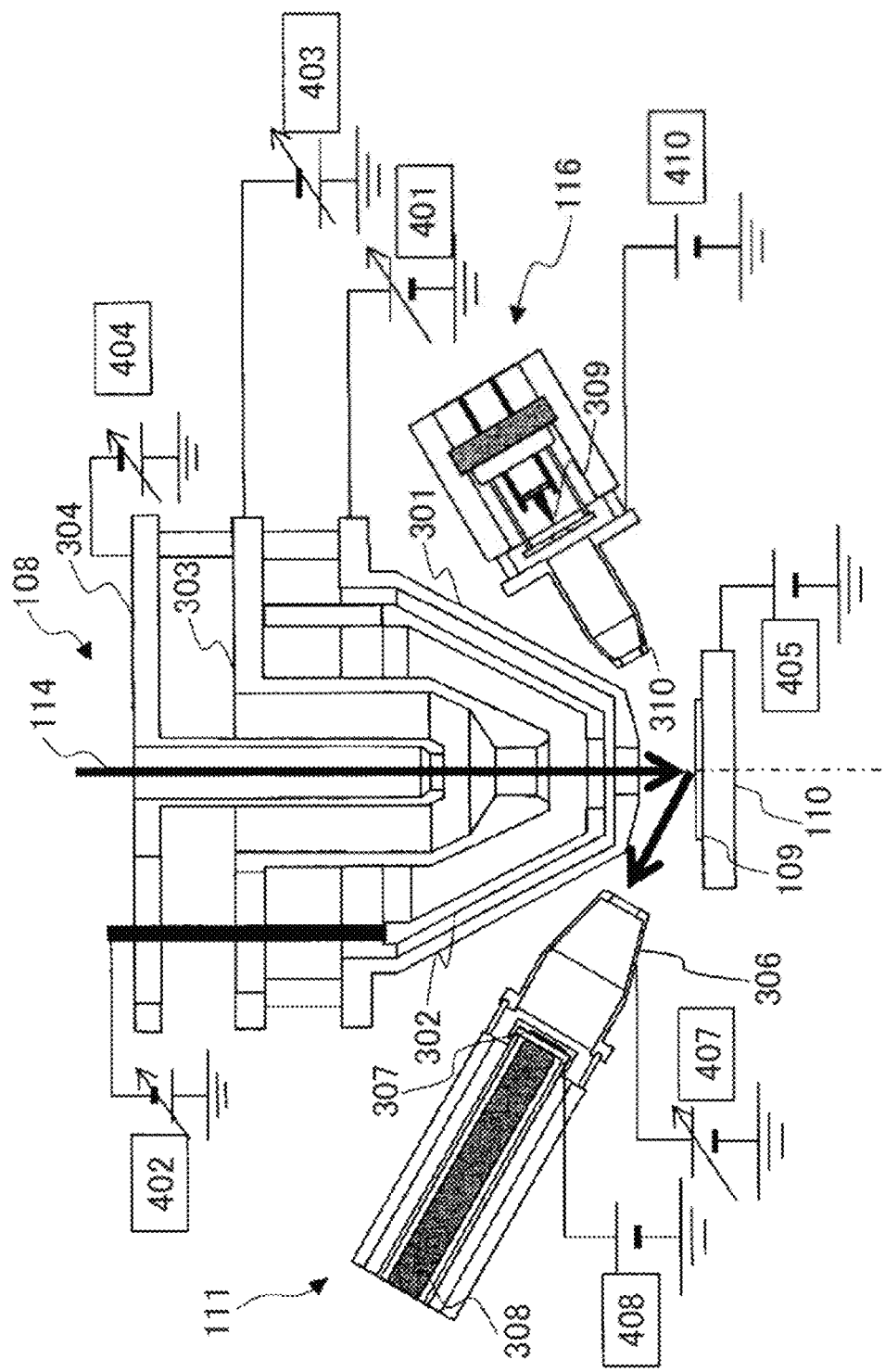
FIG. 3 is a cross-sectional view illustrating an example of a main portion (a structure of a sample chamber) in the ion beam apparatus according to the first embodiment of the present invention.

FIG. 3 illustrates an internal state of the sample chamber of the ion microscope according to the present embodiment illustrated in FIG. 1. The objective lens 108 includes four electrodes 301, 302, 303, and 304. FIG. 4 schematically illustrate spaces between the electrodes of electrostatic lens. A first space s1 between the electrode 301 closest to the sample stage 110 on which the sample is placed and the electrode 302 second closest to the sample is smaller than each of a second space s2 between the electrode 302 second closest to the sample stage 110 and the electrode 303 third closest to the sample stage 110 and a third space s3 between the electrode 303 third closest to the sample stage 110 and the electrode 304 fourth closest to the sample stage 110. Further, the second space s2 is substantially the same or smaller than the third space s3.

Figure 4A:
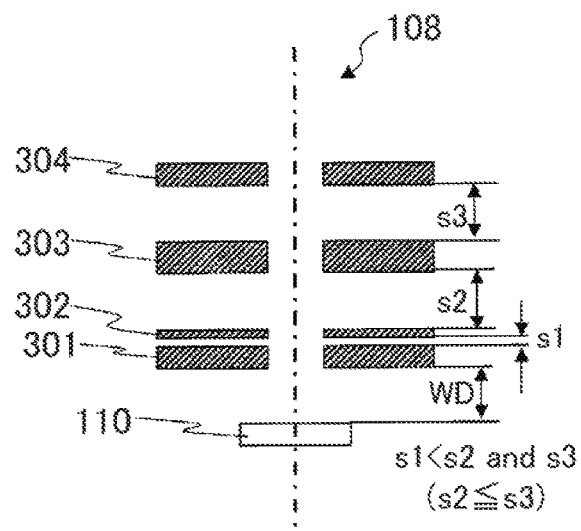
Figure 4B:
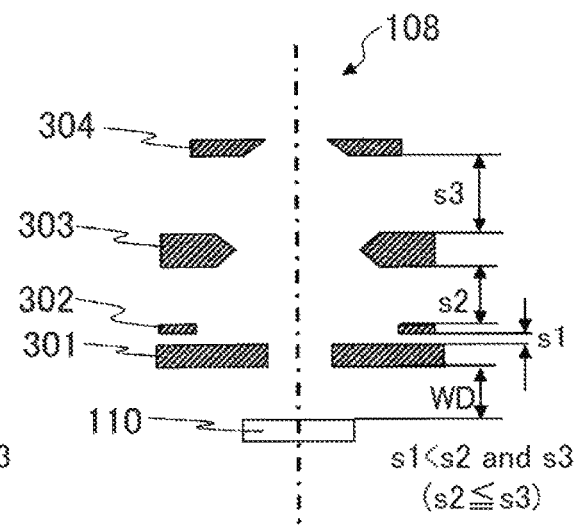
Figure 4C:
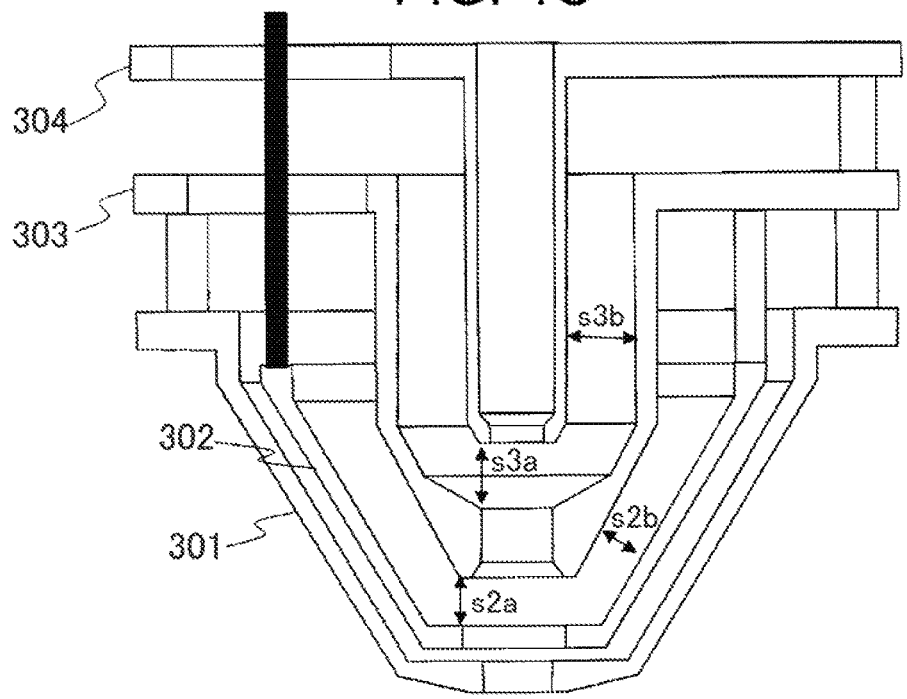

In this example, in FIG. 4(A), each electrode shape is a flat donut-shaped disc having the same hole diameter and the electrode space means a parallel disc distance. However, even if the shape of the lens electrode is not the donut-shaped disc having the same hole diameter, as illustrated in FIG. 4(B), a hole diameter of each electrode may be different from each other, or a hole side of the electrode may have a pointed shape. In addition, the shape of the lens electrode is not the flat donut-shaped disc, but may be a shape illustrated in FIG. 4(C). In the electrode shape illustrated in FIG. 4(C), as the electrode spaces, there are a distance s2a closest to the vicinity of the hole through which the ion beam passes and a gap s2b in the periphery of the lens electrode. In order to reduce an aberration of the electrostatic lens and to provide a stable structure free from an accident such as discharge against the application of a high voltage, the present inventors have found that s2a is set to be substantially the same as or smaller than s2b. For that reason, in the present embodiment, the distance between the electrodes is not the closest distance between the electrodes but the closest distance in the vicinity of the hole through which the ion beam passes. Therefore, in the space between the electrode 302 and the electrode 303 in FIG. 4(C), when s2a and s2b are compared with each other in the drawing, even if s2b is shorter, the space between the electrode 302 and the electrode 303 is set to s2a. Again, it is preferable that s2a is the same as or shorter than s2b. Likewise, the space between the electrode 303 and the electrode 304 in FIG. 4(C) is selected from s3a, s3b, or the like. However, the space between the electrode 203 and the electrode 204 is set to s3a.

In the present embodiment, the first space between the electrode 301 closest to the sample and the electrode 302 second closest to the sample is set to 0.5 mm, the second space between electrode 302 second closest to the sample and the electrode 303 third closest to the sample is set to 4 mm, and the third space between the electrode 303 third closest to the sample and the electrode 304 fourth closest to the sample is set to 4 mm. However, those spaces are not limited to those numerals.

Further, the respective electrodes are electrically insulated from each other, and as illustrated in FIG. 3, a voltage can be applied to those electrodes from the respective four high-voltage power supplies 401, 402, 403, and 404. However, the effect of the present embodiment can be obtained also in the absence of the high voltage power supply 401 and the high voltage power supply 404 among those four high voltage power supplies. In particular, in the case of providing a power supply capable of applying different voltages to the two electrodes of the electrostatic lens or providing only two power supplies, the apparatus cost can be reduced.

Incidentally, the charged particle detector 111 has an electrode 306 at a tip thereof and includes a phosphor 307, and a photomultiplier tube 308 disposed on an atmospheric side. A reference numeral 407 denotes a power source for an electrode application at the tip of the charged particle detector, and a reference numeral 408 denotes a power supply for a phosphor application. The electron gun 116 includes an electron emitter 309, an electron irradiation electrode 310, and so on. The electron emitter 309 and the electron irradiation electrode 310 are also electrically insulated from each other, and a voltage can be applied to the electron emitter 309 and the electron irradiation electrode 310 from two high voltage power supplies 409 and 410 (however, the high voltage power supply 409 is not shown). The sample stage 110 is also electrically insulated, and a voltage can be applied from a high voltage power supply (sample application power supply) 405.

Next, the operation of the gas field ion source according to the present embodiment will be described. When a sufficient time has elapsed after the evacuation, the refrigerator 104 is operated. This causes the emitter tip 121 to be cooled. First, a positive high voltage is applied to the emitter tip 121 as the ion acceleration voltage. Then, a high voltage is applied to the lead electrode 124 so as to provide a negative potential to the emitter tip 121. Then, a strong electric field is generated at the tip of the emitter tip. When an ionized gas is supplied from the supply mechanism 126 of the ionized gas, the ionized gas is polarized by the strong electric field and pulled to an emitter tip surface. Further, the ionized gas reaches the vicinity of the tip of the emitter tip 121 greatest in electric field emitter tip 121. Therefore, the ionized gas is subjected to gas field ionization to generate the ion beam 114. The ion beam 114 is guided to the ion beam irradiation system through the hole 127 of the extraction electrode 124.

Next, the operation of the ion beam irradiation system will be described below. The operation of the ion beam irradiation system is controlled according to a command from the main body controller 199. The ion beam 114 generated by the gas field ion source 101 sequentially passes through the focusing lens 105, the beam limiting aperture (first aperture) 106, and the objective lens 108 (electrodes 304, 303, 302, 301) and is irradiated on the sample 109 on the sample stage 110. First, an ion optical condition is that magnification at which the ion light source is imaged on the sample is set to at least 0.5 or more to obtain a large current. A signal from the charged particle detector 111 is modulated in luminance and transmitted to the main body controller 199. The main body controller 199 generates a scanning ion microscope image and displays the image on the image display unit. In this way, observation of the sample surface is realized.

Next, the operation of the ionized gas supply mechanism, which is a feature of the present embodiment, will be described. A mixed gas of a helium gas having concentration of 99% and a hydrogen gas having concentration of 1% is encapsulated in a mixed gas chamber 140 having a content of 5 liters at a pressure of about 5 MPa. The mixed gas chamber valve 141 is opened to introduce the mixed gas of helium and hydrogen into the gas reservoir 143. In this example, a gas pressure in the gas reservoir 143 is adjusted to about 500 Pa which is equal to or less than 0.1 Mpa by the aid of the gas fine adjustment valve 142. The gas pressure in the gas reservoir 143 is monitored by the gas pressure measuring unit 144. The pressure between the mixed gas chamber valve 141 and the gas fine adjustment valve 142 is kept constant to, for example, 0.4 MPa by the aid of a pressure adjuster attached to the mixed gas chamber 140, the effect of improving a gas pressure adjustment precision in the gas reservoir 143 is exerted. Next, when a temperature of the hydrogen selective transmission membrane 146 is raised by the hydrogen selective transmission membrane heating mechanism 147 in a state where the second gas supply pipe valve 150 is closed, only hydrogen gas passes through the hydrogen selective transmission membrane 146. Further, the hydrogen gas is introduced into the vacuum chamber 115 of the gas field ion source through the hydrogen gas purifier 148. Then, the voltage between the emitter tip 121 and the extraction electrode 124, that is, the extraction voltage is set to 3 kV. Then, as has already been mentioned, the hydrogen gas is polarized by the strong electric field and is pulled by the emitter tip surface. Further, the hydrogen gas reaches the vicinity of the tip of the emitter tip 121 that is strongest in electric field, where the hydrogen gas is subjected to the gas field ionization to generate the hydrogen ion beam 114. The hydrogen ion beam 114 is guided to the ion beam irradiation system through the hole 127 of the extraction electrode 124. Then, as has already been described, the main body controller 199 generates the scanning ion microscope image when the sample is irradiated with the hydrogen ion beam by the aid of the arithmetic processor 199*b* and displays the generated scanning ion microscope image on an image display unit.

Next, the temperature of the hydrogen selective hydrogen transmission membrane 146 is lowered stop the hydrogen gas supply. Then, the second gas supply pipe valve 150 is opened. In this way, the mixed gas of helium and hydrogen is introduced into the vacuum chamber 115 of the gas field ion source. Then, the extraction voltage is set to 8 kV. Then, as has already been described, the helium gas and the hydrogen gas are polarized by the strong electric field and pulled to the emitter tip surface. In this situation, the hydrogen gas is ionized on the way to the emitter tip and hardly reaches the emitter tip. However, the helium gas reaches the vicinity of the tip of the emitter tip 121 strongest in the electric field. Therefore, the helium gas is subjected to the gas field ionization to generate a helium ion beam. Similarly, the helium ion beam is guided into the ion beam irradiation system through the hole 127 of the extraction electrode 124.

Then, as has already been described, the main body controller 199 generates the scanning ion microscopic image when the sample is irradiated with the helium ion beam by the aid of the arithmetic processer 199*b* and displays the generated scanning ion microscope image on the image display unit. The present inventors have found that contrast of the scanning ion image thus obtained is different from that of the scanning ion image caused by the hydrogen ion beam irradiation. Those two types of scanning ion images are stored in the storage unit 199*c* of the main body controller 199 and subjected to arithmetic processing such as addition, subtraction, multiplication, and division by the arithmetic processor 199*b* to obtain elemental information and state information on the sample.

In the present embodiment, it can be found that the concentration of hydrogen introduced into the vacuum chamber 115 in which the gas field ion source 101 is disposed can be controlled to concentration different from the concentration of the mixed gas chamber 140. First, with the adjustment of the gas fine adjustment valve 142, the gas pressure in the gas reservoir 143 can be controlled. The hydrogen gas having concentration of 1% controls the temperature of the hydrogen selective permeable membrane whereby the amount of hydrogen gas passing through the hydrogen selective transmission membrane is controlled to produce a hydrogen gas substantially 100% in concentration which is supplied to the vacuum chamber 115. The amount of hydrogen gas to be supplied is controlled according to the gas pressure in the gas reservoir 143 and the temperature of the hydrogen selective transmission membrane 146. When the second gas supply pipe valve 150 is opened, the hydrogen gas with concentration of 1% is supplied to the vacuum chamber 115. Therefore, with the above control, the hydrogen gas concentration can be controlled from 1% to 100%. Accordingly, the hydrogen concentration controller 296 controls at least one of the gas fine adjustment valve 142, the gas pressure measuring unit 144 in the gas reservoir 143, the heating mechanism 147 for the hydrogen selective transmission membrane 146, and the degree of opening and closing the second gas supply pipe valve 150.

In this example, when the extraction voltage is set to 3 kV, the helium gas and the hydrogen gas reach the vicinity of the tip of the emitter tip 121. Although helium is hardly ionized, hydrogen is ionized to generate a hydrogen ion beam. In that case, the present inventors have found that a phenomenon that an ionic current of hydrogen becomes somewhat unstable occurs due to the presence of the helium gas. Incidentally, the extraction voltage of hydrogen ions and the extraction voltage of helium ions are stored in the storage unit 199c of the main body controller 199 and if the extraction voltage is switched as necessary, efficient switching is enabled between the hydrogen ion beam and the helium ion beam, to thereby improve the efficiency of sample observation and elemental analysis/state analysis.

Meanwhile, the mixed gas chamber 140 is covered with the cover 151, and if gas leaks from the mixed gas chamber by any chance, a warning is issued by the hydrogen gas sensor 152.

As described above, the stable hydrogen ion beam and helium ion beam can be obtained with the use of a mixed gas of helium and hydrogen. Although the hydrogen gas having concentration of about 1% is used in the present embodiment, the present inventors have found that if the concentration of hydrogen gas in the mixed gas chamber 140 is set to 0.1% or more and an explosive lower limit or less, that is, about 4% or less, the mixed gas is supplied to the emitter tip 121 to stably obtain the hydrogen gas ions and stably obtain the helium ions. In other words, the present inventors have found out that it is essential to set the hydrogen ionization electric field to be lower than that of other gas species and reduce the concentration of hydrogen gas as compared with other gases when the hydrogen gas coexists with other gases. In particular, when the concentration of hydrogen is set in the above concentration range, the ion beam apparatus that is excellent in the stability of the hydrogen ion beam and easy in the adjustment of intensity with other gas ion species is provided. Further, with the concentration of hydrogen set to the explosive lower limit, that is, about 4% or less, when the pressure of the mixed gas is higher than the atmospheric pressure by any chance, even if the mixed gas leaks to the outside of the chamber, safety measure is obtained. Therefore, it is possible to simplify safety measures. Therefore, it is possible to simplify safety measures.

Up to now, at the time of supplying the hydrogen gas, the high pressure gas chamber of 100% hydrogen gas with 1 Mpa or more has been used. However, if the hydrogen gas leaked from a chamber or a pipe particularly containing the hydrogen gas of 1 atmospheric pressure or more, there was a risk of the hydraulic gas explosion in a place where the ion beam apparatus was installed. This problem can be avoided by applying the present invention.

Furthermore, the use of the helium ions has the effect of realizing more stable operation. In particular, helium is high in ionization electric field, and even when coexisting with hydrogen, the helium ion emission is hardly affected in a state where the high extraction voltage is applied. On the contrary, the present inventors have found that when the hydrogen ions are emitted, although the helium gas exists in a neutral state, the helium gas does not affect the stability of hydrogen gas so much. The present embodiment obtains the advantages described above. With the above configuration, the ion beam apparatus in which the gas field ion source is mounted, and diverse advantages are obtained with the use of two or more types of gas species including at least the hydrogen gas can be obtained.

In particular, when the sample is irradiated with the hydrogen ion beam, the observation, measurement, and processing of the sample with less damage can be performed. In addition, the observation image when the sample is irradiated with the hydrogen ion beam and the observation image when the sample is irradiated with the other helium beam are compared with each other or calculated, to thereby obtain more detailed information on the surface or inside of the sample. The present invention obtains the advantages described above.

In addition, in the present embodiment, the mixed gas of the helium gas and the hydrogen gas is used, but the present invention is also applicable to other inert gases such as neon, argon, krypton, xenon, or a nitrogen gas and an oxygen gas.

In each gas species, the hydrogen gas can be supplied to the vacuum chamber 115 of the gas field ion source with optimum hydrogen gas concentration by the hydrogen gas concentration controller. In other words, the effect of easily adjusting the hydrogen ion intensity and other gas ion intensity when the mixed gas is used is obtained.

With the above configuration, the ion beam apparatus in which the gas field ion source is mounted, and the diverse advantages are obtained with the use of two or more types of gas species including at least the hydrogen gas and the inert gas is provided. The concentration of hydrogen gas in the chamber is set to 0.1% or more and the explosive lower limit or less. The mixed gas is supplied to the emitter tip to stably obtain the hydrogen gas ions. In particular, when the concentration of hydrogen is set in the above concentration range, the ion beam apparatus that is excellent in the stability of the hydrogen ion beam and easy in the adjustment of the intensity with other gas ion species is provided. When the sample is irradiated with the hydrogen ion beam, the observation, measurement, and processing of the sample with less damage can be performed. In addition, high speed processing can be performed with the use of the ion beam of the inert gas species such as neon, argon, krypton, or xenon. The high speed processing effect increases more as the mass number of the gas species increases more. In addition, the observation image when the sample is irradiated with the hydrogen ion beam and the observation image when the sample is irradiated with the inert gas pieces ion beam are compared with each other or calculated, to thereby obtain more detailed information on the surface or inside of the sample. Further, the use of the inert gas ion species has the effect of realizing the more stable operation. The present invention obtains the advantages described above.

In particular, when using neon, the present inventors have found that the hydrogen ion beam is stabilized (stabilization of the beam current value) when the mixed gas of the hydrogen gas and the neon gas is introduced into the vacuum chamber 115. Conceivably, this is because the neon gas adsorbs to the emitter tip and hydrogen is ionized in an upper layer of the emitter tip. In addition, the use of a neon ion beam has the effects of enabling high speed processing as compared with hydrogen and helium. Incidentally, not only two types of mixed gas, but also a mixed gas of three types of helium, neon, and hydrogen gas having concentration of about 4% or less may be used. Likewise, a mixed gas containing a plurality of gas species may be employed.

Moreover, as has already been described, when the non-evaporable getter pump is installed in the vacuum chamber including the emitter tip, the ion beam apparatus in which the gas field ion source is mounted, and diverse advantages are obtained with the use of two or more types of gas species including at least the hydrogen gas is provided. The hydrogen gas concentration in the chamber is set to not less than 0.1%, and not more than the explosive lower limit. The non-evaporable getter pump is effective to remove an impurity gas contained in the mixed gas. The hydrogen gas is also evacuated by the non-evaporable getter pump, but because the hydrogen gas concentration is in a large amount of 0.1% or more, the exhaust capacity of the hydrogen gas is saturated. On the other hand, the present inventors have found that the impurity gas concentration can be reduced because the exhaust of the other impurity gases is enabled. If the gas species contained in the mixed gas is the inert gas, because the inert gas is hardly exhausted by the non-evaporable getter pump, the effect described above is particularly remarkable. The present invention has the advantages described above.

As has been described above, the ion beam apparatus according to the present embodiment is equipped with the controller for the power supplies for supplying at least a voltage to be applied to the emitter tip and a voltage to be applied to the extraction electrode, in which the controller for those power supplies or the main controller 199 can store an ion extraction voltage that is a difference between the voltage to be applied to the emitter tip and the voltage to be applied to the extraction electrode, and stores at least the helium ion extraction voltage and the hydrogen ion extraction voltage. With the above configuration, the ion beam apparatus in which the gas field ion source is mounted, and diverse advantages are obtained with the use of two or more types of gas species including at least the hydrogen gas and the helium gas is provided. The hydrogen gas concentration in the chamber is set to not less than 0.1%, and not more than the explosive lower limit. In the case of using the helium ions, a relatively high optimum extraction voltage is employed as the ion extraction voltage that is the difference between the voltage to be the emitter tip and the voltage to be applied to the extraction electrode. On the other hand, in the case of using the hydrogen ions, a relatively low optimum extraction voltage is employed. With the above configuration, the respective ion intensities can be easily adjusted to an optimum state. With the above configuration, when the sample is irradiated with the hydrogen beam, the observation, measurement, and processing of the sample with less damage can be performed. In addition, the observation image when the sample is irradiated with the hydrogen ion beam and the observation image when the sample is irradiated with the helium ion beam are compared with each other or calculated, to thereby obtain more detailed information on the surface or inside of the sample. Further, the use of the helium ions has the effect of realizing the more stable operation. In particular, helium is high in ionization electric field, and even when coexisting with hydrogen, the helium ion emission is hardly affected in a state where the high extraction voltage is applied. On the contrary, the present inventors have found that when the hydrogen ions are emitted, although the helium gas exists in a neutral state, the helium gas hardly affects the stability of hydrogen gas so much. The present embodiment obtains the advantages described above.

As in the ion beam apparatus according to the present embodiment, the ion beam apparatus is provided in which when the hydrogen gas concentration of the mixed gas chamber is supplied to the vicinity of the emitter tip with concentration different from the concentration of the mixed gas chamber, the gas field ion source is mounted, and diverse advantages are obtained with the use of two or more types of gas species including at least the hydrogen. The hydrogen gas concentration in the chamber is set to not less than 0.1%, and not more than the explosive lower limit. It has been found that the more stable hydrogen beam can be obtained in the case where when the mixed gas is supplied to the emitter tip, the mixed gas is supplied around the emitter tip with a change in the concentration of the mixed gas depending on a temperature of the emitter tip. Also, it has been found that the more stable ion beam can be obtained by lowering the hydrogen gas concentration depending on the gas other than the hydrogen gas species. In particular, when the hydrogen concentration set in the above concentration range is suitable for removing the hydrogen gas, and a sufficient amount to obtain the hydrogen ion beam is obtained. With the above configuration, when the sample is irradiated with the hydrogen beam, the observation, measurement, and processing of the sample with less damage can be performed. In addition, high speed processing can be performed with the use of the ion beam of another gas species. In addition, the observation image when the sample is irradiated with the hydrogen ion beam and the observation image when the sample is irradiated with another gas pieces ion beam are compared with each other or calculated, to thereby obtain more detailed information on the surface or inside of the sample. The present invention obtains the advantages described above.

Next, the operation of the objective lens illustrated in FIG. 3 will be described in detail.

First, the ion acceleration voltage was set to 2 kV in order to observe the sample without causing any large damage. The sample 109 was at a ground potential. The electrodes 301, 303, and 304 among the four electrodes of the objective lens 108 were at the ground potential, and a positive high voltage 1 kV was applied to the electrode 302 second closest to the sample so as to focus the ion beam 114 on the sample. In this case, an orbit of the ion beam 114 is controlled by an electric field generated by the electrode 301 closest to the sample, the electrode 302 second closest to the sample, and the electrode 303 third closest to the sample among the four electrodes of the objective lens, and focused on the sample. A voltage may be supplementarily applied to the electrode 303 third closest to the sample to focus the ion beam 114 onto the sample. In this example, the electrode 301 closest to the sample 109 and the electrode 303 are arranged at asymmetric positions with respect to the electrode 302 second closest to the sample 109 in a relationship of the electrode 301 closest to the sample 109, the electrode 302 second closest to the sample 109, and the electrode 303 third closest to the sample 109. As for the shape of the electrode, the electrode 301 and the electrode 302 are substantially flat, which is suitable for bringing the electrode 302 closer to the sample. In this case, a principal plane of the objective lens 108 is formed in the vicinity of the electrode 302 second closest to the sample 109. The acceleration voltage is as low as 2 kV and the voltage to be applied to the electrode 302 second closest to the sample 109 is also low. For that reason, sufficient reliability can be maintained even when the electrode 302 is brought close to the electrode 301, and a focal length of the objective lens 108 can be shortened, and therefore it became possible to reduce the aberration of the lens. In other words, even at the acceleration voltage of 2 kV, a beam diameter of about 1 nm is obtained as a sufficiently small beam diameter. From the above fact, a low damage observation can be realized by irradiation with a low acceleration voltage ion beam.

Next, in order to carry out more detailed observation, the ion acceleration voltage was set to 50 kV. The sample was at the ground potential. The electrodes 301, 302, and 304 among the four electrodes of the objective lens 108 were at the ground potential, and a positive high voltage 40 kV was applied to the electrode 303 third closest to the sample 109 so as to focus the ion beam 114 on the sample. In this case, the orbit of the ion beam 114 is controlled by an electric field generated by the electrode 302 second closest to the sample

109, the electrode 303 third closest to the sample 109, and the electrode 304 fourth closest to the sample 109 among the four electrodes of the objective lens 108, and focused on the sample. In this case, a principal plane of the objective lens 108 is formed in the vicinity of the electrode 303 third closest to the sample 109. In other words, a focal length of the objective lens 108 is longer than the focal length at the time of the acceleration voltage 2 kV. A voltage may be supplementarily applied to the electrode 302 second closest to the sample 109 so as to focus the ion beam 114 on the sample. Although the focal length at this time slightly changes, the above essence does not change. The electrode 304 fourth closest to the sample 109 is disposed symmetrically with respect to the electrode 302 second closest to the sample 109 in a relationship of the electrode 302 second closest to the sample 109, the electrode third closest to the sample 109, and the electrode 304 fourth closest to the sample 109. In addition, as the shape of the electrode, the electrode 303 is thicker than the other electrodes and has an inclined structure toward the center, which is a so-called Butler type, and is particularly suitable for reducing the spherical aberration. This feature is particularly suitable for reducing the lens aberration when increasing the restricted divergence angle of the beam to irradiate a large current ion beam. Further, as described above, the electrode 301 and the electrode 302 have a flat structure, and the combination of the electrode 303 and the electrode 304 having the Butler type feature is a structural feature of the objective lens 108. This structure is suitable for providing the effect of the present embodiment.

Further, the electrode 302, the electrode 303, and the electrode 304 are sufficiently reliable against the application of a high voltage of 40 kV because intervals between the respective intervals is sufficient, and the electrode 303 third closest to the sample 109 is brought closer to the electrode 302 second closer to the sample 109, thereby being capable of reducing the aberration of the lens. In other words, a very small beam diameter of about 0.2 nm is obtained even at the acceleration voltage of 50 kV. From the above viewpoint, ultrahigh resolution observation can be realized by irradiation with high acceleration voltage ion beam. The ultrahigh resolution observation when the ion acceleration voltage is set to 50 kV is emphasized. When hydrogen or helium is used as the ion species, the sputtering rate may decrease depending on a material of the sample. In addition, the present inventors have found that the distribution spread of the ions incident onto the sample is large, and the local damage is reduced. In other words, the present inventors have found that when a high accelerating voltage is applied, low damage observation or ultra-high accuracy dimensional measurement with low damage could be realized.

If the combination of the operation of the two types of objective lenses at the ion acceleration voltage of 2 kV and the ion acceleration voltage of 50 kV with the hydrogen ion beam irradiation and another type of ion beam irradiation is freely made, observation and processing can be realized under various conditions.

For example, if the use of hydrogen having a relatively small mass number is suitable for observation of the surface of the sample electrode with the ion beam, and the use of neon, argon, krypton, or xenon having a relatively large mass number is suitable for processing the sample with the ion beam.

In particular, when the sample is irradiated with neon, argon, krypton, or xenon having a relatively large mass number at a high acceleration voltage of 20 kV or more, a sputtering rate is particularly improved and high speed processing can be realized. Conversely, depending on the sample material, if an acceleration voltage of about 2 kV is applied for irradiation of the specimen, the processing can be performed with less damage.

The condition such as the voltage applied to the objective lens when a relatively high acceleration voltage is used and the condition such as the voltage to be applied to the objective lens when a relatively low acceleration voltage is used are stored in the main body controller 199, and the suitable conditions are called according to the purpose of the ion beam irradiation and the structure and material of the sample to perform observation, processing, and measurement. In particular, when two or more of different conditions are stored for one wafer, and switched for measurement in a short time, the throughput of measurement can be improved.

In particular, in the present embodiment, the objective electrostatic lens was configured by four electrodes, thereby being capable of matching the optical axes of the respective electrodes with each other with high precision. In other words, when a difference in the center axes of the respective electrodes was adjusted within 20 micrometers at a maximum, the aberration could be reduced. This made it possible to form an extremely fine beam. Even if the number of electrodes is four or more, if the same electrode configuration is employed, the effect of the present embodiment can be obtained. An auxiliary addition of the number of electrodes also falls within the scope of the present invention.

In the present embodiment, although a positive high voltage is applied to the lens electrode, a negative high voltage may be applied. In this case, although an absolute value of the voltage to be applied increases, the effect that the aberration can be further reduced is obtained.

As described above, in the present embodiment, when observation, processing, and measurement are performed with the gas ion beam, the sample can be irradiated with the gas ion beam while changing the ion energy. When the ion beam is focused on the sample, the focal length of the electrostatic lens including four electrodes is set to be different between at least two different acceleration voltages, thereby being capable of reducing the aberration of the electrostatic lens for each acceleration voltage. In other words, the beam diameter on the sample can be reduced with each acceleration voltage. As a result, the ultrahigh resolution observation can be realized by the high acceleration voltage ion beam irradiation while the low damage observation can be realized by the low acceleration voltage ion beam irradiation. In addition, when the sample is irradiated with the ion beam with a change in the acceleration voltage depending on the sample structure to measure the sample structure dimension, the dimensional measurement can be realized with high precision under the respective acceleration voltage conditions. When the sample is irradiated with the ion beam with a change in the acceleration voltage depending on the sample material to perform fine processing, the extremely fine high-speed processing can be realized under the respective acceleration voltage conditions. The present invention obtains the advantages described above.

Further, according to the present embodiment, when the ion beam is focused on the sample with respect to at least two different acceleration voltages, a voltage highest in an absolute value is applied to an electrode A relatively close to the sample among the four electrodes of the electrostatic lens when a relatively low first acceleration voltage is applied to the emitter tip. The voltage highest in the absolute value is applied to an electrode B relatively far from the sample among the four electrodes of the electrostatic lens when a relatively high second acceleration voltage is applied to the emitter tip. As a result, the aberration of the electrostatic lens can be reduced for each of the acceleration voltages. In other words, the beam diameter on the sample can be reduced with each acceleration voltage.

As described above, the present embodiment can realize the ultrahigh resolution observation, the low-damage observation, high-precision size measurement and the extremely fine high speed processing. Further, the present embodiment provides the ion beam apparatus in which the gas field ion source is mounted, and diverse advantages are obtained with the use of two or more types of gas species including at least the hydrogen gas.

Second Embodiment

Next, an example of an ion beam apparatus according to a second embodiment of the present invention will be described with reference to FIGS. 5 and 6. The features described in the first embodiment and not described in the present embodiment can also be applied to the present embodiment as long as there is no particular circumstance.

Figure 5:
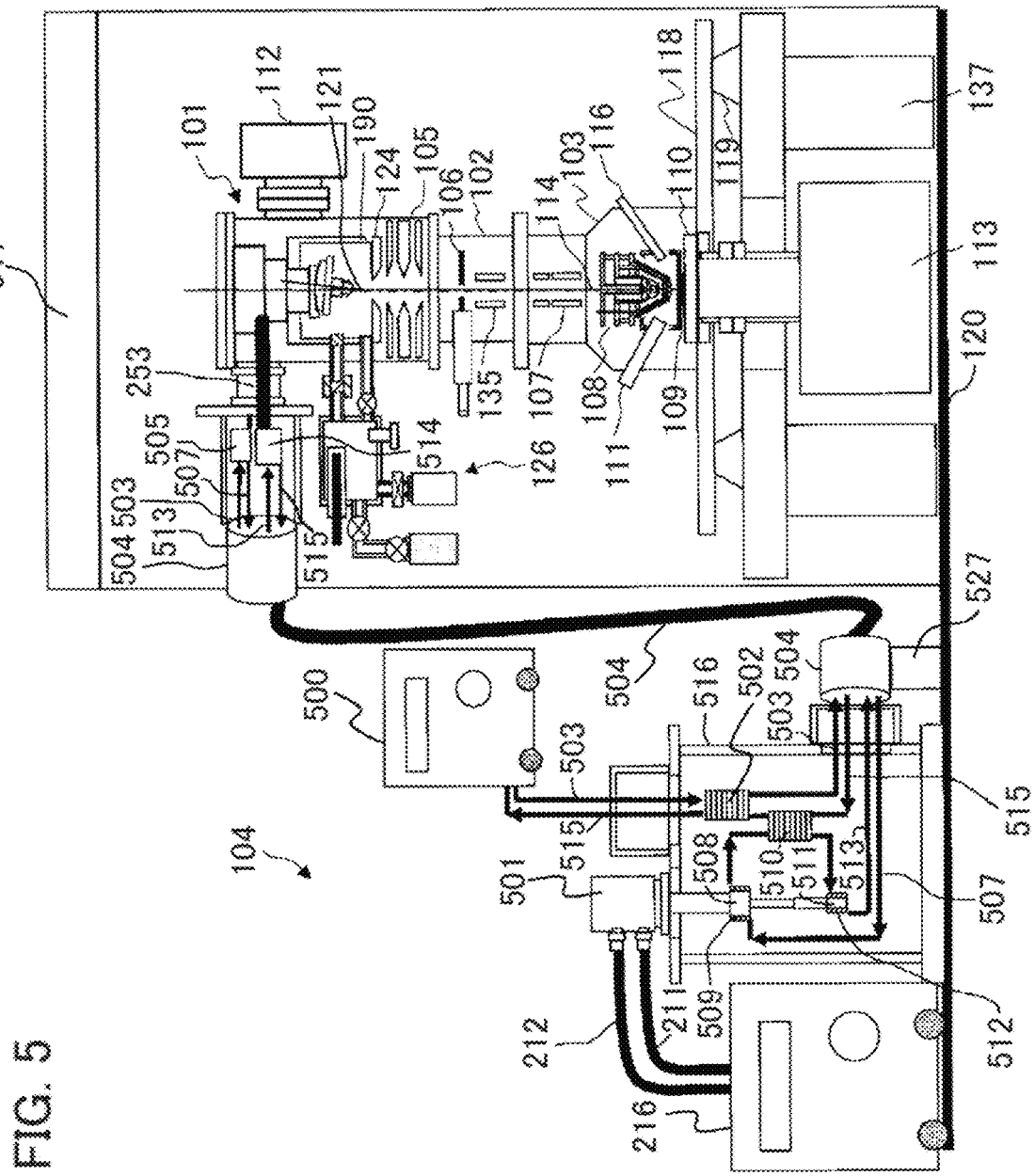
FIG. 5 is a schematic configuration diagram illustrating one example of an ion beam apparatus according to a second embodiment of the present invention.

FIG. 5 is a schematic configuration diagram illustrating an example of the ion beam apparatus according to the present embodiment. A helium circulation system is adopted for a cooling mechanism 104 of the present embodiment. FIG. 6 illustrates a gas supply mechanism 126 and a hydrogen gas concentration control mechanism in the ion beam apparatus illustrated in FIG. 5 in detail. In this example, a periphery of an emitter tip is surrounded by a cylindrical wall 190 and an extraction electrode 124 to configure a gas molecule ionization chamber 159 which is of a structure in which a pressure of a supplied gas rises around the emitter tip and an ion current can be increased, and a gas supply pipe is connected to the ionization chamber 159.

First, an example of the ion beam apparatus according to the present embodiment will be described with reference to FIG. 5. In the figure, an example of the cooling mechanism 104 of the ion beam apparatus illustrated in FIG. 1 will be described in detail.

The cooling mechanism 104 according to the present embodiment cools a helium gas as a refrigerant with the use of a GM type refrigerator 501 and heat exchangers 502, 509, 510, 512, and circulates the helium gas by a compressor unit (compressor) 500. The helium gas of 0.9 MPa pressurized by the compressor 500 and having a temperature 300 K that is an ordinary temperature flows into the heat exchanger 502 through a pipe 503 and is cooled to a temperature of about 60 K by exchanging heat with a return low-temperature helium gas to be described later. The cooled helium gas is transported through the pipe 503 in a thermally insulated transfer tube 504 and flows into the heat exchanger 505 disposed in the vicinity of the gas field ion source 101. In this example, a thermal conductor (not shown) thermally integrated with the heat exchanger 505 is cooled to a temperature of about 65K to cool a shield reducing the thermal radiation and the like. The heated helium gas flows out of the heat exchanger 505 and flows through a pipe 507 into the heat exchanger 509 which is thermally integrated with a primary cooling stage 508 of the GM type refrigerator 501, is cooled to a temperature of about 50 K and flows into the heat exchanger 510. The helium gas exchanges heat with the return low-temperature helium gas which will be described later and is cooled to a temperature of about 15 K. Thereafter, the helium gas flows into the heat exchanger 512 which is thermally integrated with the secondary cooling stage 511 of the GM type refrigerator 501, cooled to a temperature of about 9 K, transported through a pipe 513 in the transfer tube 504, flows into a heat exchanger 514 disposed in the vicinity of the gas field ion source 101, and cools a cooling conduction rod 253 of a high thermal conductor which is thermally connected to the heat exchanger 514 to a temperature of about 10 K. The helium gas heated by the heat exchanger 514 sequentially flows into the heat exchangers 510 and 502 through a pipe 515, exchanges heat with the above-described helium gas, reaches a temperature of about 275 K which is substantially an ordinary temperature, and is collected into a compressor unit 500 through a pipe 515. The above-described low temperature portion is housed in a vacuum neat insulating chamber 516 and is adiabatically connected to the transfer tube 504 although not shown. In addition, in the vacuum heat insulating chamber 516, although not shown, the low temperature portion prevents heat invasion by radiant heat from the room temperature portion by the aid of a radiation shield plate, a laminated heat insulating material, or the like.

Further, the transfer tube 504 is rigidly fixedly supported to a floor 120 or a support 527 installed on the floor 120. In this example, although not shown, the pipes 503, 507, 513, and 515 fixedly supported inside of the transfer tube 504 are fixedly supported to the floor 120 by a neat insulating body made of plastic material containing glass fiber which is a heat insulating material having low thermal conductivity. In addition, the transfer tube 504 is fixedly supported to a base plate 118 in the vicinity of the gas field ion source 101, and likewise although not shown, the pipes 503, 507, 513, and 515 fixedly supported inside of the transfer tube 504 are also fixedly supported to a base plate 118 by a heat insulating body made of plastic material containing glass fiber which is a heat insulating material having low thermal conductivity.

In other words, the present cooling mechanism is a cooling mechanism that cools an object to be cooled by cold generating means for expanding a first high pressure gas generated by a compressor unit (compressor) 216 to generate cold and the helium gas that is a second moving refrigerant that is cooled by the cold of the cold generating means and circulated in the compressor unit 500. Reference numerals 211 and 212 denote helium gas pipes.

The cooling conduction rod 253 is connected to the emitter tip 121 through a deformable copper stranded wire (wire binding about 1,000 copper wires of 50 micrometers in diameter) and a sapphire base, thereby realizing cooling of the emitter tip 121. In the present embodiment, the GM type refrigerator 501 causes the floor to vibrate. However, the gas field ion source 101, the ion beam irradiation system column 102, the sample chamber 103 and the like are isolated from the GM refrigerator. Further, the pipes 503, 507, 513, and 515 that are coupled to the heat exchangers 505 and 514 installed in the vicinity of the gas field ion source 101 are rigidly fixedly supported to the floor 120 and the base plate 118 which hardly vibrate and do not vibrate, and furthermore are vibration-insulated from the floor. As a result, a system extremely less in the transmission of mechanical vibration is provided.

In this example, the GM type refrigerator 501 is used, but a pulse tube refrigerator or a Stirling refrigerator may be used instead. In the present embodiment, the refrigerator has two cooling stages but may have a single cooling stage and the number of cooling stages is not particularly limited. For example, with a helium circulation refrigerator using small Stirling refrigeration with a single cooling stage, and setting a minimum cooling temperature to 50 K, a compact and low cost ion beam apparatus can be realized. In this case, neon gas or hydrogen may be used instead of helium gas.

According to the gas field ion source and the ion beam apparatus of the present embodiment, the vibration from the cooling mechanism is hardly transmitted to the emitter tip, and the fixing mechanism of the emitter base mount is provided. Therefore, the vibration of the emitter tip is prevented and the high resolution observation can be performed.

Further, the present inventors have ascertained that the sound of the compressor 216 or 500 vibrates the gas field ion source 101 to degrade its resolution. For that reason, in the present embodiment, a soundproof cover 517 was installed in the ion beam apparatus that spatially separates the compressor 216 and the gas field ion source 101 from each other. This can reduce influence of the vibration caused by the sound of the compressor 216. With the above configuration, the high resolution observation can be performed. In particular, in order to prevent sound, it is essential to eliminate a gap. The optical magnification of the ion source with respect to the sample is large, and the vibration of the emitter tip appears as the beam vibration on the sample. For that reason, the prevention of vibration is important to improve the performance.

Figure 6:
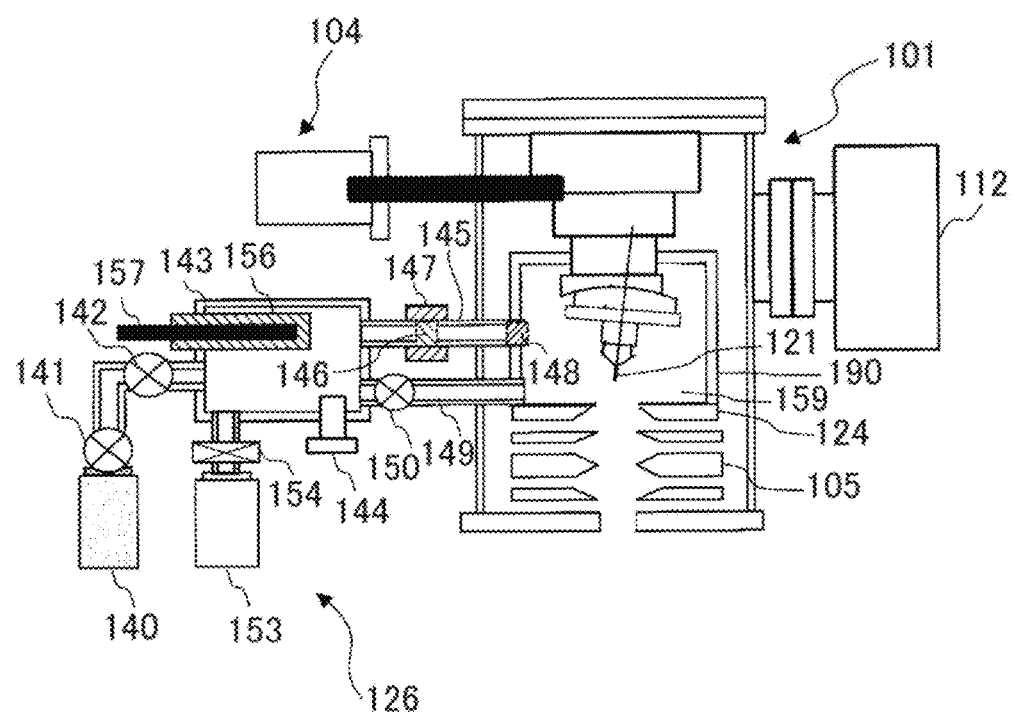
FIG. 6 is a schematic configuration diagram illustrating an example of a main portion (a gas field ion source and a gas supply mechanism) in the ion beam apparatus according to the second embodiment of the present invention.

FIG. 6 illustrates the gas field ion source 101 and the gas supply mechanism 126 of the ion beam apparatus according to the present embodiment. The details of the refrigerating mechanism 104 were omitted.

First, the operation of the gas field ion source 101 and the ion beam irradiation system and the operation of acquiring a scan ion image are the same as those of the ion beam apparatus described in the first embodiment.

Further, the gas supply mechanism 126 includes a mixed gas chamber 140, a mixed gas chamber valve 141, a gas fine adjustment valve 142, a gas reservoir 143, a gas pressure measuring unit 144, a first gas supply pipe 145, a hydrogen selective transmission membrane 146, a hydrogen selective transmission membrane heating mechanism 147, a hydrogen gas purifier 148, a second gas supply pipe 149, a second gas supply pipe valve 150, a mixed gas chamber cover (not shown), a gas reservoir exhaust pump 153, a gas reservoir exhaust pump valve 154, a non-evaporable getter material 156, a heating mechanism 157 for the non-evaporable getter material, and the like.

Next, the operation of the ionized gas supply mechanism will be described. First, in the mixed gas container 140 having a volume of 10 liters, a mixed gas of a helium gas having concentration of 96% and a hydrogen gas having concentration of 4% is sealed at a pressure of about 10 Mpa. In this example, the hydrogen gas concentration is a volume ratio of the hydrogen gas to a total gas.

First, the non-evaporable getter material 156 is heated by the heating mechanism 157 to activate the non-evaporable getter material 156. In this example, the gas emitted from the non-evaporable getter material 156 by opening the gas reservoir exhaust pump valve 154 is exhausted by the a gas reservoir exhaust pump 153. The non-evaporable getter material 156 can efficiently occlude the hydrogen gas. After the temperature of the non-evaporable getter material 156 has sufficiently dropped, the gas reservoir exhaust pump valve 154 is closed.

Next, the mixed gas chamber valve 141 is opened, and the mixed gas of helium and hydrogen is introduced into the gas reservoir 143. In this example, a gas pressure in the gas reservoir 143 is adjusted to about 200 Pa which is 0.1 Mpa or less by the gas fine adjusting valve 142. The gas pressure in the gas reservoir 143 is monitored by the gas pressure measuring unit 144. A pressure between the mixed gas chamber valve 141 and the gas fine adjusting valve 142 is kept constant to, for example, 0.4 Mpa by attaching a pressure adjuster to the mixed gas chamber 140, as a result of which the effect of improving the gas pressure adjustment precision in the gas reservoir 143 is obtained.

In this example, among the mixed gas of helium and hydrogen introduced, hydrogen gas is occluded in the non-evaporable getter material 156. On the other hand, the helium gas is hardly adsorbed. In addition, the nitrogen gas and the oxygen gas of the impurity gas are adsorbed by the non-evaporable getter material 156. In this situation, the helium gas is exhausted from the gas reservoir exhaust pump 153 by opening the gas reservoir exhaust pump valve 154. Thereafter, the non-evaporable getter material 156 is heated by the heating mechanism 157 to emit the occluded hydrogen gas. In this situation, the temperature of the non-evaporable getter material 156 is controlled so that impurity gases such as a nitrogen gas and an oxygen gas are not emitted much. As a result, the impurity gas concentration in the mixed gas is reduced. The heating mechanism 157 of the non-evaporable getter material 156 is controlled by the non-evaporable getter material temperature controller 291 illustrated in FIG. 2. The non-evaporable getter material temperature controller can also be incorporated in the hydrogen concentration controller 296.

Next, when the temperature of the hydrogen selective transmission membrane 146 is increased by the selective hydrogen transmission membrane heating mechanism 147 in a state where the second gas supply pipe valve 150 is closed, only the hydrogen gas passes through the selective hydrogen transmission membrane 146. Furthermore, the hydrogen gas is introduced through the hydrogen gas purifier 148 into the vacuum chamber 115 in which the gas field ion source 101 is installed. Then, a voltage between emitter tip 121 and the extraction electrode 124, in other words, an extraction voltage is set to 3 kV. Then, as has already been described, the hydrogen gas is polarized by a strong electric field and pulled onto the emitter tip surface. Further, the hydrogen gas reaches the vicinity of a distal end of the emitter tip 121 strongest in the electric field. In this situation, the hydrogen gas is subjected to field ionization to generate the hydrogen ion beam. The hydrogen ion beam is guided to the ion beam irradiation system through the hole of the extraction electrode 124. Then, as has already been described, the main controller 199 generates a scanning ion microscope image when the sample is irradiated with the hydrogen ion beam, and displays the generated scanning ion microscope image on the image display unit.

In the present embodiment, impurities in the hydrogen gas are almost completely removed, and the stability of the hydrogen ion beam is dramatically improved.

Likewise, first, the non-evaporable getter material 156 is heated by the heating mechanism 157 to activate the non-evaporable getter material 156. In this example, the gas reservoir exhaust pump valve 154 is opened and the gas emitted from the non-evaporable getter material 156 is exhausted by the gas reservoir exhaust pump 153. When the temperature of the non-evaporable getter material 156 has been reduced sufficiently, the gas reservoir exhaust pump valve 154 is closed.

Then, the mixed gas chamber valve 141 is opened to introduce the mixed gas of helium and hydrogen into the gas reservoir 143. In this example, the gas pressure in the gas reservoir 143 is adjusted to about 200 Pa that is 0.1 MPa or less by the gas fine adjusting valve 142. The gas pressure in the gas reservoir 143 is monitored by the gas pressure measuring unit 144. In this situation, among the mixed gases of helium and hydrogen introduced, the hydrogen gas is occluded in the non-evaporable getter material 156. On the other hand, the helium gas is hardly adsorbed. Further, the nitrogen gas, the oxygen gas, and so on of the impurity gases are adsorbed to the non-evaporable getter material 156. In this example, the helium gas that has been purified by opening the second gas supply pipe valve 150 is introduced into the vacuum chamber 115 to which the gas field ion source 101 is installed. Then, the extraction voltage is set to 8 kV. As a result, as has already been described, the helium gas reaches the vicinity of the distal end of the emitter tip 121 strongest in the electric field. In that state, the helium gas is subjected to the field ionization to generate the helium ion beam.

Then, as has already been described, the main body controller 199 generates the scanning ion microscopic image when the sample is irradiated with the helium ion beam and displays the generated scanning ion microscope image on the image display unit. In this case, contrast of the obtained scanning ion image is different from that of the scanning ion image obtained by irradiation with the hydrogen ion beam. Those two types of scanning ion images are stored in the storage unit of the main body controller 199 and element information and state information of the sample are obtained by arithmetic processing such as addition, subtraction, multiplication, and division.

In the present embodiment, it can be seen that the concentration of hydrogen gas and the concentration of helium gas introduced into the vacuum chamber 115 in which the gas field ion source 101 is installed can be controlled to concentration different from the concentration of the mixed gas chamber 140. First, the gas pressure in the gas reservoir 143 can be controlled by adjusting the gas fine adjusting valve 142. The hydrogen gas having concentration of 4% controls the temperature of the hydrogen selective transmission membrane 146, whereby the amount of hydrogen gas that passes through the hydrogen selective transmission membrane 146 is controlled so that the concentration of hydrogen gas becomes nearly 100% and the amount of impurity gases is extremely small, which is supplied to the vacuum chamber 115. The amount of hydrogen gas to be supplied is controlled according to the gas pressure in the gas reservoir 143 and the temperature of the hydrogen selective transmission membrane 146. When the second gas supply pipe valve 150 is opened, the helium gas having concentration of approximately 100%, that is, the hydrogen gas having concentration of approximately 0% is supplied to the vacuum chamber 115. Therefore, with the above control, the hydrogen gas concentration can be controlled from 0% to 100%. The hydrogen concentration controller 296 controls at least one of the gas fine adjusting valve 142, the gas pressure measuring unit 144 in the gas reservoir 143, the heating mechanism 147 of the hydrogen selective transmission membrane, the opening degree of the second gas supply pipe valve 150, the heating mechanism 157 of the non-evaporable getter material 156, and the gas reservoir exhaust pump valve 154.

In the present embodiment, the mixed gas of the helium gas and he hydrogen gas is used, but the present invention can also be applied to other inert gases such as neon, argon, krypton, and xenon.

For each gas species, the hydrogen gas can be supplied to the vacuum chamber 115 in which the gas field ion source 101 is installed with optimum concentration of the hydrogen gas by the hydrogen gas concentration controller 296. In other words, the hydrogen ion intensity and other gas ion intensities in the case of using the mixed gas are easily adjusted.

In the present embodiment, the mixed gas containing the hydrogen, gas having the concentration of 4% is used. For that reason, even if the mixed gas leaks to the outside from the mixed gas chamber 140 by any chance, because the concentration of hydrogen gas is low in comparison with a lower explosion limit of hydrogen gas against air, no explosion accident occurs. Because the amount of gas for forming the ion beam is normally small, such consideration has not been taken. However, when the ability of the gas field ion source 101 to be used is maximized, as has already been described, there is a need to extremely reduce the mechanical vibration. This is because optical magnification of the ion source to the sample is large and the vibration of the emitter tip appears as the beam vibration on the sample. Also, in the present embodiment, the soundproof cover 517 was installed in the ion beam device, and as compared with the soundproof cover of the conventional ion beam device, a structure in which a gap is further reduced is provided. With the structure of such a device, if even a small amount of hydrogen gas leaked, the hydrogen gas stayed in the sound-proofing cover and a concern of hydrogen explosion increased. In other words, this was an idea never born in the conventional way of thinking.

According to the embodiment described above, there is provided an ion beam apparatus including the vacuum chamber, the gas field ion source having the emitter tip, the extraction electrode that is disposed to face the emitter tip, and the gas supply means for supplying the gas to the emitter tip in the vacuum chamber, the electrostatic lens that focuses the ion beam emitted from the emitter tip, the deflector that deflects the ion beam that has passed through the focusing lens, and the secondary particle detector that irradiates the sample with the ion beam to detect the secondary particles emitted from the sample, in which the gas supply means includes the mixed gas chamber containing at least the hydrogen gas and the inert gas or the nitrogen gas, the chamber that includes a material adsorbing the hydrogen, and the pipe that supplies the hydrogen to the vicinity of the emitter tip.

With the above configuration, the ion beam apparatus in which the gas field ion source is mounted, and diverse advantages are obtained with the use of two or more types of gas species including at least the hydrogen gas is obtained. When the mixed gas is supplied to the emitter tip, hydrogen gas is first adsorbed in the chamber containing a material which adsorbs the hydrogen gas. The gases other than the hydrogen gas not adsorbed are exhausted by the evacuation pump. Thereafter, hydrogen is emitted from the material that adsorbs hydrogen. In this situation, the emission of other impurity gases is reduced under the temperature control. As a result, the hydrogen gas higher in purity is obtained. As a result, the present inventors have found that the hydrogen ion beam current is particularly stabilized.

In this case, when the sample is irradiated with the hydrogen beam, the observation, measurement, and processing of the sample with less damage can be performed. Also, with the use of the ion beam of the inert gas species such as neon, argon, krypton, and xenon enables high-speed processing. The effect increases as the mass number of gas species increases. In addition, the observation image when the sample is irradiated with the hydrogen ion beam and the observation image when the sample is irradiated with the other helium beam are compared with each other or calculated, to thereby obtain more detailed information on the surface or inside of the sample. Further, with the use of the inert gas ion species, the more stable operation is realized. The configuration of the present invention obtains the advantages described above.

The present inventors have found that particularly in the case of using neon, the hydrogen ion beam is stabilized when the mixed gas of the hydrogen gas and the neon gas is introduced into the vacuum chamber 115. Conceivably, this is because the neon gas adsorbs to the emitter tip and hydrogen is ionized on an upper layer of the emitter tip.

Further, the embodiment described above provides the ion beam apparatus having the pipe for supplying the inert gas or the nitrogen gas to the vicinity of the emitter tip apart from the pipe for supplying hydrogen to the vicinity of the emitter tip.

With the above configuration, the ion beam apparatus in which the gas field ion source is mounted, and diverse advantages are obtained with the use of two or more types of gas species including at least the hydrogen gas is obtained. When the mixed gas is supplied to the emitter tip, the hydrogen concentration is first lowered in the chamber containing the material that adsorbs the hydrogen gas. In this situation, if the hydrogen concentration is too high, a burden on the hydrogen gas adsorbing material is heavy. The inert gas or the nitrogen gas contained in the mixed gas whose hydrogen concentration has been lowered is supplied to the emitter tip. As a result, a stable inert gas or nitrogen gas ion beam can be obtained. On the other hand, hydrogen is emitted from the material that adsorbs hydrogen. In this situation, the emission of other impurity gases is reduced under the temperature control. As a result, the hydrogen gas higher in purity is obtained. As a result, the hydrogen ion beam current is particularly stabilized. In this way, when the sample is irradiated with the obtained hydrogen beam, the observation, measurement, and processing of the sample with less damage can be performed. Also, with the use of the ion beam of other inert gas species or the nitrogen gas, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The configuration of the present invention obtains the advantages described above.

Further, the above embodiment provides the ion beam apparatus in which the pipe for supplying hydrogen to the vicinity of the emitter tip is equipped with a purifier for lowering the concentration of impurity gas different from hydrogen gas.

With the above configuration, the ion beam apparatus in which the gas field ion source is mounted, and diverse advantages are obtained with the use of two or more types of gas species including at least the hydrogen gas is obtained. The hydrogen gas is first adsorbed in the chamber containing a material which adsorbs the hydrogen gas. The gases other than the hydrogen gas not adsorbed are exhausted by the evacuation pump. Thereafter, hydrogen is emitted from the material that adsorbs hydrogen. In this situation, the emission of other impurity gases is reduced under the temperature control. As a result, the hydrogen gas higher in purity is obtained. Further, the hydrogen gas is allowed to pass through the purifier for lowering the concentration of impurity gas different from the hydrogen gas. As a result, the more stable hydrogen ion beam is obtained. In this way, when the sample is irradiated with the obtained hydrogen beam, the observation, measurement, and processing of the sample with less damage can be performed. The configuration of the present invention obtains the advantages described above.

Further, the above-described embodiment provides the ion beam; apparatus in which the hydrogen selective transmission membrane is provided between the chamber containing the material for adsorbing hydrogen and the pipe for supplying the adsorbed hydrogen to the vicinity of the emitter tip.

With the above configuration, the ion beam apparatus in which the gas field ion source is mounted, and diverse advantages are obtained with the use of two or more types of gas species including at least the hydrogen gas is provided. The hydrogen gas is first adsorbed in the chamber containing a material which adsorbs the hydrogen gas. The gases other than the hydrogen gas not adsorbed are exhausted by the evacuation pump. Thereafter, hydrogen is emitted from the material that adsorbs hydrogen. In this situation, the emission of other impurity gases is reduced under the temperature control. As a result, the hydrogen gas higher in purity is obtained. Further, the hydrogen gas is allowed to pass through the hydrogen selective transmission membrane to lower the impurity gas concentration. As a result, the more stable hydrogen ion beam is obtained. In this way, when the sample is irradiated with the obtained hydrogen beam, the observation, measurement, and processing of the sample with less damage can be performed. The configuration of the present invention obtains the advantages described above.

Furthermore, in another example of the ion beam apparatus according to the present embodiment, there are two types of gas supply pipes, a heating mechanism and an exhaust path are provided in the gas supply paths, at least two exhaust paths are connected to a vacuum pump, and a valve for separating at least two exhaust paths from each other is provided.

Figure 8:
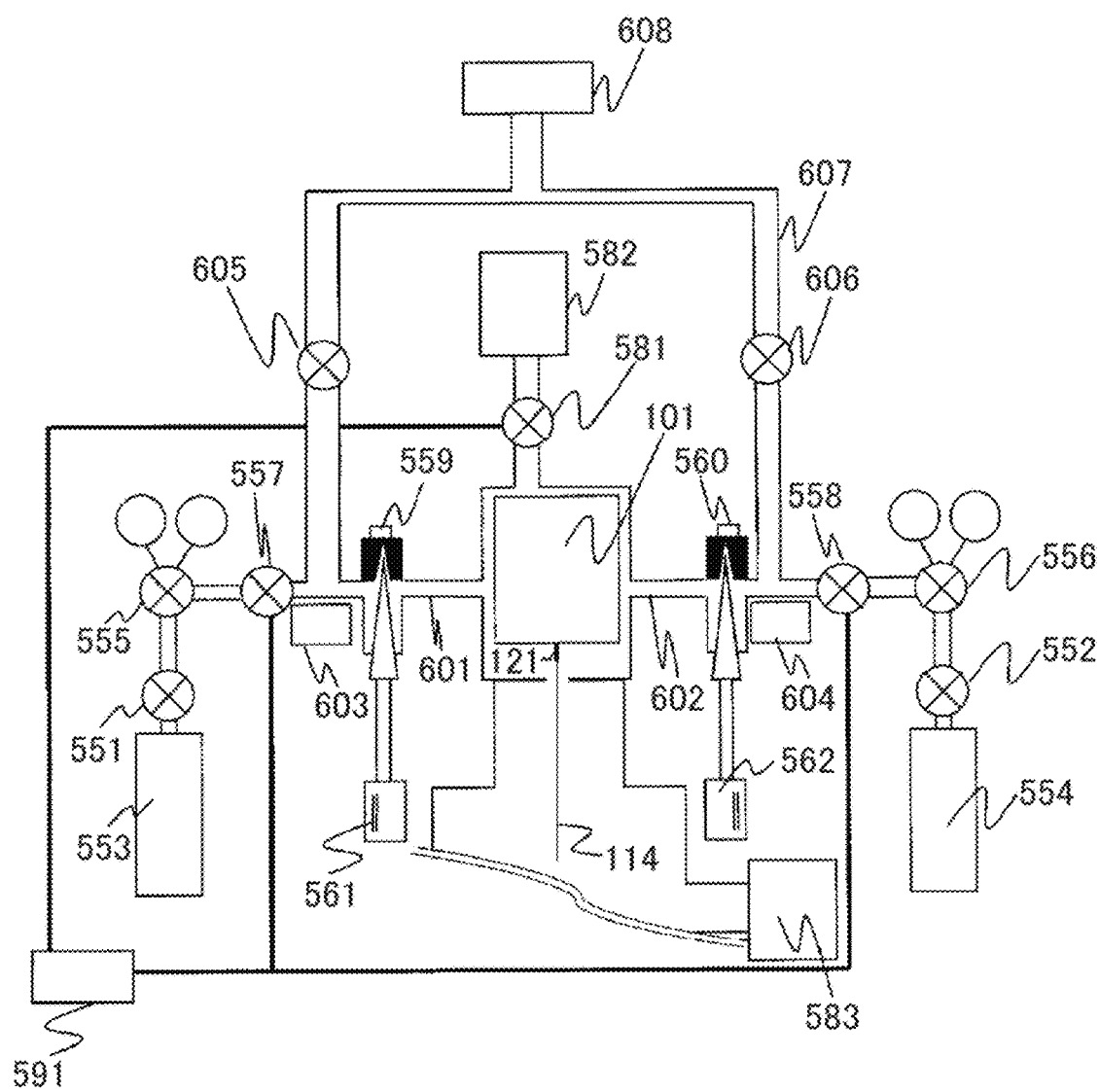
FIG. 8 is a schematic configuration diagram illustrating another example of a main portion (a gas supply mechanism and an ion source) in the ion beam apparatus according to the second embodiment of the present invention.

The present embodiment will be described with reference to FIG. 8. FIG. 6 illustrates the details of the gas supply mechanism and ion source. The gas supply mechanism includes two systems of a first system having a gas cylinder 553 with a cylinder valve 551, a pressure reducing valve 555, a stop valve 557, and a fine flow adjusting valve 559 that can adjust a fine gas flow rate and a second system having a gas cylinder 551 with a cylinder valve 552, a pressure reducing valve 556, a stop valve 558, and a fine flow adjusting valve 560 that can adjust a fine gas flow rate. The fine flow adjusting valves 559 and 560 are configured by, for example, needle valves. The first gas cylinder 553 of one system is filled with diluted hydrogen at a high pressure. The other second gas cylinder 554 is filled with any one of argon, xenon, krypton, neon, oxygen, and nitrogen at a high pressure. A tungsten emitter 121 is provided at the tip of the gas field ion source 101. In the present embodiment, an example in which the first gas cylinder 553 is filled with diluted hydrogen and the second gas cylinder 554 is filled with xenon will be described. The non-evaporable getter material that adsorbs the hydrogen gas is not illustrated in FIG. 8, but can be installed in a desired place.

Next, the operation of the ion source will be described. The cylinder valve 551 of the hydrogen cylinder 553 is opened, and the pressure in the gas pipe is then adjusted by the pressure reducing valve 555. Next, the stop valve 557 for performing opening and closing for the gas supply to the ion source is opened. Finally, the gas flow rate into the ion source is adjusted by the fine flow adjusting valve 559. The gas flow rate is adjusted so that the gas pressure of the ion source becomes about 0.2 Pa. In this case, a high voltage of 20 kV is applied to the tungsten emitter 121 to extract hydrogen ions from the tip. In this case, the gas flow rate is adjusted by the fine flow adjusting valve 559 so as to maximize the amount of hydrogen ion beam, and the applied high voltage is also adjusted. A fine flow adjusting knob 561 is fixed and a discharge voltage is stored in a controller 591. Next, the stop valve 557 is closed, and the voltage application is canceled to stop the hydrogen beam. Then, a bypass valve 581 is opened to evacuate the hydrogen in the ion source by a vacuum pump 582. Incidentally, the ion source column is also evacuated by a vacuum pump 583. Likewise for the xenon gas, the xenon cylinder valve 552 is opened, a pressure in the gas pipe is adjusted by the pressure reducing valve 556 to open the stop valve 558. Finally, the flow rate of gas into the ion source is adjusted by the fine flow adjusting valve 560 to generate ion emission. For xenon, as well as hydrogen, the gas flow rate is adjusted with the fine flow adjusting valve 560 so as to make the amount of xenon ion beam proper so as to fix the fine flow adjusting knob 562. Next, in order to switch to the hydrogen beam, similarly, the stop valve 558 is closed, the application of the discharge voltage is canceled to stop the discharge of xenon, and the bypass valve 581 is opened to exhaust the xenon in the ion source.

With the above configuration, the ion beam apparatus is provided in which the gas field ion source 101 is mounted, and diverse advantages are obtained with the use of two or more types of gas species including at least the hydrogen gas. Further, gas exhaust supply pipes 601 and 602 are heated with heaters 603 and 604, respectively, and the temperature is lowered at the time of supplying the gas, to thereby reduce the discharged impurity gas from the pipes. The present inventors have ascertained that although there is a need to treat each of the two types of gas supply pipes, it is important to prevent the impurity gas in one pipe 601 from contaminating the other pipe 602. In other words, when the pipe 601 is heated by the heater 603 in order to clean the hydrogen supply pipe, a separation valve 606 is closed so as not to contaminate the xenon gas. The impurity gas at this time is evacuated by a vacuum pump 608 through a vacuum pipe 607. In addition, when the pipe 602 is heated by the heater 604 in order to clean the xenon gas supply pipe, a separation valve 605 is closed so as not to contaminate the hydrogen gas supply pipe 601. The impurity gas at this time is exhausted by the vacuum pump 608 through the vacuum pipe 607. The impurity gas concentration or the ionized gas to be supplied can be lowered by the above processing. With the above configuration, two or more types of gas species ion beams including at least the hydrogen gas can be stably obtained. In this way, when the sample is irradiated with the obtained hydrogen beam, the observation, measurement, and processing of the sample with less damage can be performed. Also, with the use of the ion beam of other inert gas species or the nitrogen gas, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The configuration of the present invention obtains the advantages described above.

Further, in the ion beam apparatus according to the present embodiment, the purifier for hydrogen gas as a first gas is provided in a first gas supply path, a chamber with a non-evaporable getter material is provided in a second gas supply path, and an adsorption rate of the inert gas by the non-evaporable getter material is lower than an adsorption rate of hydrogen by at least one digit or more.

With the above configuration, the ion beam apparatus in which the gas field ion source is mounted, and diverse advantages are obtained with the use of two or more types of gas species including at least the hydrogen gas is provided. Further, the impurity gas concentration of the gas supply pipe can be lowered. Further, the purity of the hydrogen gas can be increased by disposing the purifier for the hydrogen gas as the first gas in the first gas supply path. Also, the chamber having the non-evaporable getter material is provided in the second gas supply path, and when the adsorption rate of the inert gas by the non-evaporable getter material is lowered by at least one digit or more as compared with the adsorption rate of hydrogen, particularly, the purity of the inert gas can be enhanced. With the above configuration, two or more types of gas species ion beams including at least the hydrogen gas can be stably obtained. In this way, when the sample is irradiated with the obtained hydrogen beam, the observation, measurement, and processing of the sample with less damage can be performed. Also, with the use of the ion beam of other inert gas species, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The configuration of the present invention obtains the advantages described above.

Third Embodiment

Next, a third embodiment of the present invention will be described. The features described in the first or second embodiment and not described in the present embodiment can also be applied to the present embodiment as long as there is no particular circumstance. In the present embodiment, a configuration in which in a gas field ion source, at least two evacuation pumps are connected to a vacuum chamber 115 having an emitter tip, a vacuum valve is provided between each evacuation pump and a vacuum chamber, and a getter material is installed in each vacuum chamber will be described with reference to FIG. 7. The cooling mechanism and the ion beam irradiation system are not shown.

First, hydrogen gas with concentration of 0.1% and neon gas with concentration of 99.9% are filled in a mixed gas chamber of an ionized gas supply mechanism 126. The hydrogen gas and the neon gas are supplied to a vacuum chamber 115 in which a gas field ion source 101 is disposed. The concentration of hydrogen gas can be controlled from 0% to 100%. Similarly to the second embodiment, a gas can be supplied to a gas molecule ionization chamber 159 surrounded by a cylindrical wall 190 and an extraction electrode 124.

Figure 7:
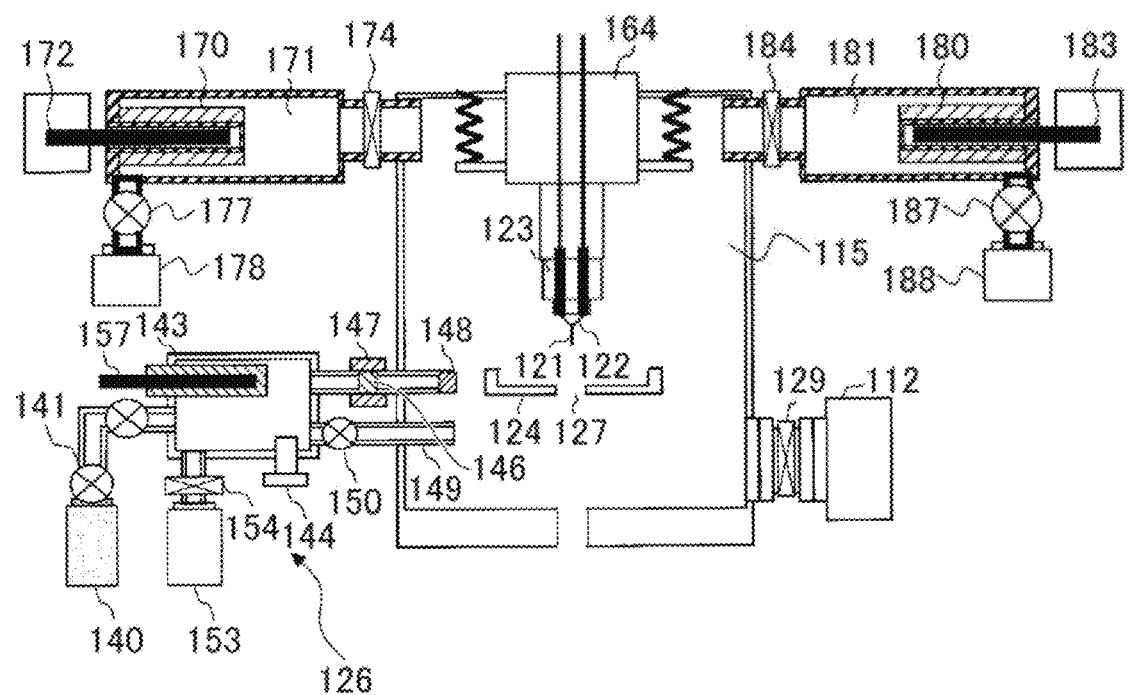
FIG. 7 is a schematic configuration diagram illustrating an example of a main portion (a gas field ion source) in an ion beam apparatus according to a third embodiment of the present invention.

In the present embodiment, on a left side of FIG. 7, a vacuum shutoff valve 174 is disposed between a vacuum chamber 171 containing a getter material (first getter material) 170 having a rate of adsorbing a hydrogen gas which is higher than a rate of adsorbing an inert gas by one digit or more and a vacuum chamber 115 as a first evaluating pump. In this case, the first getter material 170 is heated by a heating mechanism 172 to activate the first getter material 170. The impurity gas generated at this time is evacuated by the vacuum pump 178 by opening with a vacuum shutoff valve 177. When a sample is irradiated with a neon ion beam, a valve 174 is opened to remove impurity gases other than the neon gas. As a result, the effect of stabilizing the neon ion beam is obtained.

On a right side of FIG. 7, a getter material (non-evaporable getter material, second getter material) 180 having the rate of adsorbing the hydrogen gas which is lower than the rate of adsorbing the inert gas by one digit or more is included as a second evaluating pump. Also, a vacuum shutoff valve 184 is disposed between a vacuum chamber 181 and a vacuum chamber 116. In this case, the second getter material 180 is heated by a heating mechanism 183 to activate the second getter material 180. The impurity gas generated at this time is evacuated by a vacuum pump 188 by opening with a valve 187. When the sample is irradiated with a hydrogen ion beam, a valve 184 is opened to remove impurity gases other than the hydrogen gas. As a result, the effect of stabilizing the neon ion beam is obtained.

In the present embodiment, the mixed gas of neon and hydrogen gas is used, but the present invention can also be applied to other inert gases such as helium, argon, krypton, or xenon.

In other words, according to the present embodiment, there is provided an ion beam apparatus including the vacuum chamber, the gas field ion source having the emitter tip, the extraction electrode that is disposed to face the emitter tip, and the gas supply means for supplying the gas to the emitter tip in the vacuum chamber, the electrostatic lens that focuses the ion beam emitted from the emitter tip, the deflector that deflects the ion beam that has passed through the focusing lens, and the secondary particle detector that irradiates the sample with the ion beam to detect the secondary particles emitted from the sample, in which at least two evacuation pumps are connected to the vacuum chamber 115 having the emitter tip, a vacuum valve is provided between each of the evacuation pumps and the vacuum chamber, the evacuation pumps each have a getter material, a first evacuation pump contains a getter material having a rate of adsorbing the hydrogen gas which is higher than a rate of adsorbing the inert gas by one digit or more, and a second evacuation pump contains a getter material having a rate of adsorbing the hydrogen gas which is lower than the rate of adsorbing the inert gas by one digit or more.

With the above configuration, the ion beam apparatus in which the gas field ion source is mounted, and diverse advantages are obtained with the use of two or more types of gas species including at least the hydrogen gas is provided. Furthermore, the impurity gas concentration of the gas supply pipe can be reduced. The evacuation pump is installed in the vacuum chamber having the emitter tip, other gas species can be exhausted when hydrogen ions are emitted, and other gas species including the hydrogen gas can be exhausted when the inert gas ions are emitted. With the above configuration, two or more types of gas species ion beams including at least the hydrogen gas can be stably obtained. In this way, when the sample is irradiated with the obtained hydrogen beam, the observation, measurement, and processing of the sample with less damage can be performed. Also, with the use of the ion beam of other inert gas species, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The present invention obtains the advantages described above.

In the present embodiment, the hydrogen gas having concentration of 0.1% is used. However, in the case of hydrogen gas having concentration lower than that value, the amount of hydrogen gas is small relative to the ion beam formation, the mixed gas is quickly depleted, and the device utilization efficiency is reduced. It has been found that a problem arises that the amount of impurity gas relative to the amount of hydrogen gas becomes relatively large and the hydrogen ion beam current becomes unstable. It has been found that this is applied not only to the neon gas but also to other invert gas, the nitrogen gas, and so on.

Further, in the ion beam apparatus illustrated in the present embodiment, the acceleration power supply that can apply at least two different voltages to the emitter tip, the power supply for applying a voltage to the extraction electrode, the power supply for applying the voltage to the electrostatic lens, and the power supply for applying the voltage to the sample are provided. The controller for storing at least two types of values of the extraction electrode voltage, the electrostatic lens electrode voltage, and the sample voltage for the different acceleration power supplies is provided with respect to different acceleration voltages. The condition stored in the controller is called according to the sample, and a structural dimension of the sample surface is measured with the gas ion beam. When the structural dimension of the sample surface is measured with the gas ion beam, a gas suitable for the measurement can be selected from two or more types of gases including the hydrogen gas. Further, the sample can be irradiated with the gas ion beam while the acceleration voltage is changed. The advantages are obtained that the structural dimension of the sample surface can be measured under a condition relatively small in the sample damage or under a condition relatively large in the dimensional measurement precision according to the sample structure or the sample material.

In addition, if a system for managing a device manufacturing process is configured with the use of the measurement result of the structure dimensions of the sample surface with the ion beam apparatus according to the present embodiment, a yield of device manufacturing is improved, or the finer device can be manufactured.

In addition, the explosion limit of hydrogen gas ranges from a lower limit of 4.1% to an upper limit of 74.2% in the case of mixing with air. In the present specification, the lower limit of explosion limit means the lower limit of mixing with the air being 4.1%, however does not exclude the mixing ratio lower limit with oxygen being 4.65%.

In the present specification, isotopes are not distinguished from element types such, as gas names. For example, hydrogen gas also includes deuterium gas.

The present invention has been described above in detail. Hereinafter, main configurations of the present invention will be recited below. (1) There is provided an ion beam apparatus including a vacuum chamber, a gas field ion source having an emitter tip, an extraction electrode that is disposed to face the emitter tip, and gas supply means for supplying a gas to the emitter tip in the vacuum chamber, an electrostatic lens that focuses an ion beam emitted from the emitter tip, a deflector that deflects the ion beam that has passed through the focusing lens, and a secondary particle detector that irradiates a sample with the ion beam to detect secondary particles emitted from the sample, in which the gas supply means includes a mixed gas chamber containing two or more types of gases including at least a hydrogen gas, concentration of the hydrogen gas in the mixed gas chamber is equal to or lower than an explosive lower limit, and a pipe that connects the vacuum chamber having the emitter tip to the mixed gas chamber is provided.

With the above configuration, the ion beam apparatus is provided in which the gas field ion source is mounted, and diverse advantages are obtained with the use of two or more types of gas species including at least the hydrogen gas. The concentration of the hydrogen gas in the chamber is 0.1% or more and the explosion lower limit or less. The mixed gas is supplied to the emitter tip and the hydrogen gas ion is stably obtained. The present inventors have found out that it is essential to set the hydrogen ionization electric field to be lower than that of other gas species and reduce the concentration of hydrogen gas as compared with other gases when the hydrogen gas coexists with other gases. In particular, when the concentration of hydrogen is set in the above concentration range, the ion beam apparatus that is excellent in the stability of the hydrogen ion beam and easy in the adjustment of intensity with other gas ion species is provided. When the sample is irradiated with the hydrogen beam, the observation, measurement, and processing of the sample with less damage can be performed. Also, with the use of the ion beam of other inert gas species, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The present invention obtains the advantages described above. (2) The ion beam apparatus according to the above item (1) is an ion beam apparatus in which the gas species in the mixed gas chamber includes at least an inert gas.

With the above configuration, the ion beam apparatus is provided in which the gas field ion source is mounted, and diverse advantages are obtained with the use of two or more types of gas species including at least the hydrogen gas and the inert gas. The concentration of the hydrogen gas in the chamber is 0.1% or more and the explosion lower limit or less. The mixed gas is supplied to the emitter tip and the hydrogen gas ion is stably obtained. In particular, when the concentration of hydrogen is set in the above concentration range, the ion beam apparatus that is excellent in the stability of the hydrogen ion beam and easy in the adjustment of intensity with other gas ion species is provided. When the sample is irradiated with the hydrogen beam, the observation, measurement, and processing of the sample with less damage can be performed. Also, with the use of the ion beam of other inert gas species, high speed processing can be performed. The effect increases more as the mass number of gas species increases more. In addition, the observation image when the sample is irradiated with the hydrogen ion beam and the observation image when the sample is irradiated with another gas species ion beam are compared with each other or calculated, to thereby obtain more detailed information on the surface or inside of the sample. Further, in the case of using the inert gas ion species, the more stable operation is realized. The present invention obtains the advantages described above. (3) The ion beam apparatus according to the item (1) is an ion beam apparatus in which the gas species in the mixed gas chamber includes at least helium.

With the above configuration, the ion beam apparatus is provided in which the gas field ion source is mounted, and diverse advantages are obtained with the use of two or more types of gas species including at least the hydrogen gas and the inert gas. The concentration of the hydrogen gas in the chamber is 0.1% or more and the explosion lower limit or less. The mixed gas is supplied to the emitter tip and the hydrogen gas ion is stably obtained. In particular, when the concentration of hydrogen is set in the above concentration range, the ion beam apparatus that is excellent in the stability of the hydrogen ion beam and easy in the adjustment of intensity with the helium ion is provided. When the sample is irradiated with the hydrogen beam, the observation, measurement, and processing of the sample with less damage can be performed. Also, with the use of the helium ion beam, high speed processing can be performed as compared with hydrogen. In addition, the observation image when the sample is irradiated with the hydrogen ion beam and the observation image when the sample is irradiated with another gas species ion beam are compared with each other or calculated, to thereby obtain more detailed information on the surface or inside of the sample. Further, in the case of using the helium ions, the more stable operation is realized. In particular, helium has a high ionization electric field and does not much affect the emission of helium ions in a state where a high withdrawing voltage is applied even when coexisting with hydrogen. Conversely, the present inventors have found that when the hydrogen ions are emitted, the helium gas exists in a neutral state, but this does not significantly affect the stability of hydrogen gas. The present invention obtains the advantages described above. (4) The ion beam apparatus according to the item (1) is an ion beam apparatus in which the gas species in the mixed gas chamber includes at least neon.

With the above configuration, the ion beam apparatus is provided in which the gas field ion source is mounted, and diverse advantages are obtained with the use of two or more types of gas species including at least the hydrogen gas and the neon gas. The concentration of the hydrogen gas in the chamber is 0.1% or more and the explosion lower limit or less. The mixed gas is supplied to the emitter tip and the hydrogen gas ion is stably obtained. In particular, when the concentration of hydrogen is set in the above concentration range, the ion beam apparatus that is excellent in the stability of the hydrogen ion beam and easy in the adjustment of intensity with the neon ions is provided. When the sample is irradiated with the hydrogen beam, the observation, measurement, and processing of the sample with less damage can be performed. Also, with the use of the neon ion beam, high speed processing can be performed as compared with hydrogen and helium. In addition, the observation image when the sample is irradiated with the hydrogen ion beam and the observation image when the sample is irradiated with the neon ion beam are compared with each other or calculated, to thereby obtain more detailed information on the surface or inside of the sample. Further, in the case of using the neon ions, the more stable fine processing is realized. In particular, the present inventors have found that neon gas adsorbs to the surface of the emitter tip and has the effect of stabilizing hydrogen gas ion emission. The present invention obtains the advantages described above. (5) The ion beam apparatus according to the above item (1) is an ion beam apparatus in which the vacuum chamber including the emitter tip includes a non-evaporable getter pump.

With the above configuration, the ion beam apparatus is provided in which the gas field ion source is mounted, and diverse advantages are obtained with the use of two or more types of gas species including at least the hydrogen gas. The concentration of the hydrogen gas in the chamber is 0.1% or more and the explosion lower limit or less. The non-evaporable getter pump exhibits the effect of removing the impurity gases contained in the mixed gas. The hydrogen gas is also exhausted by the non-evaporable getter pump, but because the concentration of the hydrogen gas is as large as 0.1% or more, the exhaust capacity of the hydrogen gas is saturated. The present inventors have found that the concentration of impurity gas can be reduced because the exhaust of other impurity gases can be performed. In the case where the gas type contained in the mixed gas is the inert gas, because the gas is hardly exhausted by the non-evaporable getter pump, the effect is particularly noticeable. The present invention obtains the advantages described above. (6) The ion beam apparatus according to the above item (1) further includes at least a controller for a power supply that supplies a voltage to be applied to the emitter tip and a voltage to be applied to the extraction electrode, in which the power supply controller can store an ion extraction voltage that is a difference between the voltage to be applied to the emitter tip and the voltage to be applied to the extraction electrode, and stores at least a helium ion extraction voltage and a hydrogen ion extraction voltage.

With the above configuration, the ion beam apparatus is provided in which the gas field ion source is mounted, and diverse advantages are obtained with the use of two or more types of gas species including at least the hydrogen gas and the helium gas. The concentration of the hydrogen gas in the chamber is 0.1% or more and the explosion lower limit or less. For the ion extraction voltage which is a difference between the voltage to be applied to the emitter tip and the voltage to be applied to the extraction electrode, a relatively high optimum extraction voltage is used when helium ions are used. On the other hand, when the hydrogen ions are used, a relatively low optimum extraction voltage is used. With the above configuration, each ionic strength can be easily adjusted in an optimal state. With the above configuration, when the sample is irradiated with the hydrogen beam, the observation, measurement, and processing of the sample with less damage can be performed. In addition, the observation image when the sample is irradiated with the hydrogen ion beam and the observation image when the sample is irradiated with the helium ion beam are compared with each other or calculated, to thereby obtain more detailed information on the surface or inside of the sample. Further, in the case of using the helium ions, the more stable operation is realized. In particular, helium has a high ionization electric field and does not much affect the emission of helium ions in a state where a high withdrawing voltage is applied even when coexisting with hydrogen. Conversely, the present inventors have found that when the hydrogen ions are emitted, the helium gas exists in a neutral state, but this does not significantly affect the stability of hydrogen gas. The present invention obtains the advantages described above. (7) The ion beam apparatus according to the above item (1) is an ion beam apparatus in which the hydrogen gas concentration in the mixed gas chamber is supplied to the vicinity of the emitter tip in different concentration from the concentration of the mixed gas chamber.

With the above configuration, the ion beam apparatus is provided in which the gas field ion source is mounted, and diverse advantages are obtained with the use of two or more types of gas species including at least the hydrogen gas. The concentration of the hydrogen gas in the chamber is 0.1% or more and the explosion lower limit or less. The present inventors have found that a more stable hydrogen beam can be obtained when the mixed gas is supplied to the periphery of the emitter tip while changing the concentration of the mixed gas depending on the temperature of the emitter tip. Also, the present inventors have found that a more stable ion beam can be obtained by lowering the hydrogen gas concentration depending on the gas other than the hydrogen gas species. In particular, when the hydrogen concentration is set in the above concentration range, the set hydrogen concentration is suitable for removing the hydrogen gas, and a sufficient amount to obtain the hydrogen ion beam is obtained. With the above configuration, when the sample is irradiated with the hydrogen beam, the observation, measurement, and processing of the sample with less damage can be performed. Also, with the use of the ion beam of other inert gas species, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The present invention obtains the advantages described above. (8) There is provided an ion beam apparatus including a vacuum chamber, a gas field ion source having an emitter tip, an extraction electrode that is disposed to face the emitter tip, and gas supply means for supplying a gas to the emitter tip in the vacuum chamber, an electrostatic lens that focuses an ion beam emitted from the emitter tip, a deflector that deflects the ion beam that has passed through the focusing lens, and a secondary particle detector that irradiates a sample with the ion beam to detect secondary particles emitted from the sample, in which the gas supply means includes a mixed gas chamber that contains at least a hydrogen gas and an inert gas or a nitrogen gas, a chamber that contains a material adsorbing the hydrogen, and a pipe that supplies the hydrogen to the vicinity of the emitter tip.

With the above configuration, the ion beam apparatus is provided in which the gas field ion source is mounted, and diverse advantages are obtained with the use of two or more types of gas species including at least the hydrogen gas. When the mixed gas is supplied to the emitter tip, the hydrogen gas is first adsorbed in the chamber containing a material which adsorbs the hydrogen gas. The gases other than the hydrogen gas not adsorbed are exhausted by the evacuation pump. Thereafter, hydrogen is emitted from the material that adsorbs hydrogen. In this situation, the emission of other impurity gases is reduced under the temperature control. Thus, the hydrogen gas higher in purity is obtained. As a result, the present inventors have found that the hydrogen ion beam current is particularly stable. In this way, when the sample is irradiated with the obtained hydrogen beam, the observation, measurement, and processing of the sample with less damage can be performed. The present invention obtains the advantages described above. (9) The ion beam apparatus according to the item (8) further includes a pipe which supplies the inert gas or the nitrogen gas to the vicinity of the emitter tip, aside from the pipe for supplying the hydrogen to the vicinity of the emitter tip.

With the above configuration, the ion beam apparatus is provided in which the gas field ion source is mounted, and diverse advantages are obtained with the use of two or more types of gas species including at least the hydrogen gas. When the mixed gas is supplied to the emitter tip, the hydrogen concentration is first lowered in the chamber containing a material which adsorbs the hydrogen gas. In this situation, if the hydrogen concentration is too high, a burden on the hydrogen gas adsorbing material is heavy. The inert gas or the nitrogen gas contained in the mixed gas whose hydrogen concentration has been lowered is supplied to the emitter tip. As a result, a stable inert gas or nitrogen gas ion beam can be obtained. On the other hand, hydrogen is emitted from the material that adsorbs hydrogen. In this situation, the emission of other impurity gases is reduced under the temperature control. Thus, the hydrogen gas higher in purity is obtained. As a result, the hydrogen ion beam current is particularly stabilized. In this way, when the sample is irradiated with the obtained hydrogen beam, the observation, measurement, and processing of the sample with less damage can be performed. Also, with the use of the ion beam of other inert gas species or the nitrogen gas, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The present invention obtains the advantages described above. (10) The ion beam apparatus according to the above item (8) is an ion beam apparatus in which a purifier that reduces impurity gas concentration different from the hydrogen gas is installed in the pipe for supplying the hydrogen to the vicinity of the emitter tip.

With the above configuration, the ion beam apparatus is provided in which the gas field ion source is mounted, and diverse advantages are obtained with the use of two or more types of gas species including at least the hydrogen gas. The hydrogen gas is first adsorbed in the chamber containing a material which adsorbs the hydrogen gas. The gases other than the hydrogen gas not adsorbed are evacuated by the evacuation pump. Thereafter, hydrogen is emitted from the material that adsorbs hydrogen. In this situation, the emission of other impurity gases is reduced under the temperature control. As a result, the hydrogen gas higher in purity is obtained. Further, the hydrogen gas is allowed to pass through the purifier for lowering the concentration of impurity gas different from the hydrogen gas. As a result, the more stable hydrogen ion beam is obtained. In this way, when the sample is irradiated with the obtained hydrogen beam, the observation, measurement, and processing of the sample with less damage can be performed. The present invention obtains the advantages described above. (11) The ion beam apparatus according to the above item (8) is an ion beam apparatus in which a hydrogen selective transmission membrane is installed between the chamber that contains the material adsorbing the hydrogen and the pipe that supplies the adsorbed hydrogen to the vicinity of the hydrogen gas pipe.

With the above configuration, the ion beam apparatus is provided in which the gas field ion source is mounted, and diverse advantages are obtained with the use of two or more types of gas species including at least the hydrogen gas. The hydrogen gas is first adsorbed in the chamber containing a material which adsorbs the hydrogen gas. The gases other than the hydrogen gas not adsorbed are evacuated by the evacuation pump. Thereafter, hydrogen is emitted from the material that adsorbs hydrogen. In this situation, the emission of other impurity gases is reduced under the temperature control. Thus, the hydrogen gas higher in purity is obtained. Further, the hydrogen gas is allowed to pass through the hydrogen selectively transmission membrane to reduce the impurity gas concentration. Thus, the more stable hydrogen ion beam is obtained. In this way, when the sample is irradiated with the obtained hydrogen beam, the observation, measurement, and processing of the sample with less damage can be performed. The present invention obtains the advantages described above. (12) The ion beam apparatus according to the above item (8) is an ion beam apparatus in which two types of gas supply pipes are provided, a heating mechanism and an exhaust path are provided in the gas supply route, at least two exhaust paths are connected to a vacuum pump, and a valve that separates at least two exhaust paths from each other is provided.

With the above configuration, the ion beam apparatus is provided in which the gas field ion source is mounted, and diverse advantages are obtained with the use of two or more types of gas species including at least the hydrogen gas. Further, the gas exhaust supply pipes are heated and the temperature is lowered at the time of supplying the gas, to thereby reduce the discharged impurity gas from the pipes. The present inventors have ascertained that although there is a need to treat each of the two types of gas supply pipes, it is essential to prevent the impurity gas in one pipe from contaminating the other pipe. The impurity gas concentration of the ionized gas to be supplied can be lowered by the above processing. With the above configuration, two or more types of gas species ion beams including at least the hydrogen gas can be stably obtained. In this way, when the sample is irradiated with the obtained hydrogen beam, the observation, measurement, and processing of the sample with less damage can be performed. Also, with the use of the ion beam of other inert gas species or the nitrogen gas, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The configuration of the present invention obtains the advantages described above. (13) The ion beam apparatus according to the above item (8) is an ion beam apparatus in which the purifier for the hydrogen gas as a first gas is provided in the first gas supply path, the chamber having the non-evaporable getter material is provided in the second gas supply path, and an adsorption rate of the inert gas to the non-evaporable getter material is lower than the adsorption rate of hydrogen by at least one digit or more.

With the above configuration, the ion beam apparatus is provided in which the gas field ion source is mounted, and diverse advantages are obtained with the use of two or more types of gas species including at least the hydrogen gas. Furthermore, the impurity gas concentration of the gas supply pipe can be lowered. Further, the purity of the hydrogen gas can be increased by disposing the purifier for the hydrogen gas as the first gas in the first gas supply path. Also, when the chamber having the non-evaporable getter material is provided in the second gas supply path, and the adsorption rate of the inert gas to the non-evaporable getter material is lower than the adsorption rate of hydrogen by at least one digit or more, the purity of the inert gas can be increased. Thus, two or more types of gas species ion beams including at least the hydrogen gas are stably obtained. In this way, when the sample is irradiated with the obtained hydrogen beam, the observation, measurement, and processing of the sample with less damage can be performed. Also, with the use of the ion beam of other inert gas species, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The configuration of the present invention obtains the advantages described above. (11) According to an embodiment of the present invention, there is provided an ion beam; apparatus including a vacuum chamber, a gas field ion source having an emitter tip, an extraction electrode that is disposed to face the emitter tip, and gas supply means for supplying a gas to the emitter tip in the vacuum chamber, an electrostatic lens that focuses an ion beam emitted from the emitter tip, a deflector that deflects the ion beam that has passed through the focusing lens, and a secondary particle detector that irradiates a sample with the ion beam to detect secondary particles emitted from the sample, in which at least two evacuation pumps are connected to the vacuum chamber having the emitter tip, the vacuum valve is provided between each of the evacuation pumps and the vacuum chamber, the evacuation pumps each have a getter material, a first evacuation pump includes the getter material having a rate of adsorbing the hydrogen gas which is higher than a rate of adsorbing the inert gas by one digit or more, and a second evacuation pump includes the getter material having a rate of adsorbing the hydrogen gas which is lower than the rate of adsorbing the inert gas by one digit or more.

With the above configuration, the ion beam apparatus is provided in which the gas field ion source is mounted, and diverse advantages are obtained with the use of two or more types of gas species including at least the hydrogen gas. Furthermore, the impurity gas concentration of the gas supply pipe can be lowered. The evacuation pump is installed in the vacuum chamber having the emitter tip, the other gas species can be evacuated when the hydrogen ions are emitted, and the other gas species including the hydrogen gas can be evacuated when the inert gas ions are emitted. Thus, two or more gas types of ion beams including at least the hydrogen gas can be stably obtained. In this way, when the sample is irradiated with the obtained hydrogen beam, the observation, measurement, and processing of the sample with less damage can be performed. Also, with the use of the ion beam of other inert gas species or the nitrogen gas, high speed processing can be performed. In addition, the observation image when the sample is irradiated with the hydrogen ion beam and the observation image when the sample is irradiated with another gas species ion beam are compared with each other or calculated, to thereby obtain more detailed information on the surface or inside of the sample. The configuration of the present invention obtains the advantages described above.

The present invention is not limited to the embodiments described above, and includes diverse modifications. For example, in the above-described embodiments, the specific configurations were described in order to easily understand the present invention. However, the present invention does not always provide all of the configurations described above. Also, a part of one configuration example can be replaced with another configuration example, and the configuration of one embodiment can be added with the configuration of another embodiment. Also, in a part of the respective configuration examples, another configuration can be added, deleted, or replaced.

LIST OF REFERENCE SIGNS

101: gas field ion source, 102: ion beam irradiation system column, 103: sample chamber, 104: cooling mechanism, 105: focusing lens, 106: movable aperture, 107: second deflector, 108: objective lens, 109: sample, 110: sample stage, 111: charged particle detector, 112: ion source evacuation pump, 113: sample chamber evacuation pump, 114: ion beam, 115: vacuum chamber, 116: electron gun, 117: ion beam irradiation system column evacuation pump, 118: base plate, 119: vibration isolation mechanism, 120: floor, 121: emitter tip, 122: filament, 123: filament mount, 124: extraction electrode, 126: gas supply mechanism, 127: opening (hole), 128: vacuum shutoff valve, 129: vacuum shutoff valve, 135: first deflector, 136: second aperture, 137: apparatus stand, 140: mixed gas chamber, 141: mixed gas chamber valve, 142: gas fine adjustment valve, 143: gas reservoir, 144: gas pressure measuring unit, 145: first gas supply pipe, 146: hydrogen selective transmission membrane, 147: hydrogen selective transmission membrane heating mechanism, 148: hydrogen gas purifier, 149: second gas supply pipe, 150: second gas supply pipe valve, 151: mixed gas chamber cover, 152: hydrogen gas sensor, 153: gas reservoir exhaust pump, 154: gas reservoir exhaust pump valve, 156: non-evaporable getter material, 157: heating mechanism for non-evaporable getter material, 159: ionization chamber, 161: tilting mechanism, 162: ion beam irradiation axis (optical axis), 164: emitter base mount, 167: differential exhaust hole, 170: non-evaporable getter (first getter), 171: vacuum chamber, 172: heating mechanism, 174: vacuum shutoff valve, 177: vacuum shutoff valve, 178: vacuum pump, 180: non-evaporable getter (second getter), 181: vacuum chamber, 183: heating mechanism, 184: vacuum shutoff valve, 188: vacuum pump, 190: cylindrical wall, 191: gas field ion source controller, 192: refrigerator controller, 193: lens controller, 195: ion beam scanning controller, 196: secondary electron detector controller, 197: sample stage controller, 198: evacuation pump controller, 199: main body controller, 211, 212: He gas pipe, 216: compressor unit (compressor), 253: cooling conduction rod, 291: non-evaporable getter temperature controller, 295: extraction electrode applied voltage power supply, 296: hydrogen concentration controller, 301, 302, 303, 304: four electrodes of objective lens, 306: electrode at a tip of charged particle detector, 307: phosphor, 308: photomultiplier tube, 309: electron emitter, 310: electron irradiation electrode, 401, 402, 403, 404: four power supplies for applying a voltage to the objective lens, 405: sample application power supply, 407: power supply for applying the electrode at the tip of the charged particle detector, 408: phosphor application power supply, 410: electron irradiation electrode application power supply, 500: compressor unit (compressor), 501: GM type refrigerator, 502, 509, 510, 512: heat exchanger, 503, 507, 513, 515: pipe, 504: transfer tube, 505, 514: heat exchanger, 508: primary cooling stage, 511: secondary cooling stage, 516: vacuum insulating chamber, 517: soundproof cover, 527: support body, 551, 552: cylinder valve, 553, 554: gas cylinder, 555, 556: pressure reducing valve, 557, 558: stop valve, 559, 560: fine flow rate adjustment valve, 561, 562: fine flow rate adjustment knob, 581: bypass valve, 582, 583: vacuum pump, 591: controller, 601, 602: gas exhaust supply pipe, 603, 604: heater, 605, 606: separation valve, 607: vacuum pipe, 608: vacuum pump.

The invention claimed is:

1. An ion beam apparatus comprising: a vacuum chamber; a gas field ion source that is installed in the vacuum chamber and has an emitter tip; an extraction electrode that is disposed to face the emitter tip; gas supply means for supplying a gas to the emitter tip; a focusing lens that focuses an ion beam emitted from the emitter tip; a deflector that deflects the ion beam that has passed through the focusing lens; and a secondary particle detector that irradiates a sample with the ion beam to detect secondary particles emitted from the sample, wherein the gas supply means includes a mixed gas chamber containing two or more types of gases including at least a hydrogen gas and a pipe that connects the vacuum chamber to the mixed gas chamber, and concentration of the hydrogen gas in the mixed gas chamber is equal to or lower than about 4% volume ratio of the hydrogen gas to a total volume of gas in the mixed gas chamber.

2. The ion beam apparatus according to claim 1, wherein the gas species in the mixed gas chamber includes at least an inert gas.

3. The ion beam apparatus according to claim 1, wherein the gas species in the mixed gas chamber includes at least helium.

4. The ion beam apparatus according to claim 1, wherein the gas species in the mixed gas chamber includes at least neon.

5. The ion beam apparatus according to claim 1, wherein the vacuum chamber including the emitter tip includes a non-evaporable getter pump.

6. The ion beam apparatus according to claim 1, further comprising a controller for a power supply that supplies a voltage to be applied to the emitter tip and a voltage to be applied to the extraction electrode,
wherein the power supply controller can store an ion extraction voltage that is a difference between the voltage to be applied to the emitter tip and the voltage to be applied to the extraction electrode, and stores at least a helium ion extraction oltage and a hydrogen ion extraction voltage.

7. The ion beam apparatus according to claim 1, wherein the gas supply means supplies the hydrogen gas concentration in the mixed gas chamber to the vicinity of the emitter tip in different concentration from concentration of the mixed gas chamber.

8. The ion beam apparatus according to claim 1, wherein at least two evacuation pumps are connected to the vacuum chamber having the emitter tip, a vacuum valve is provided between each of the evacuation pumps and the vacuum chamber, the at least two evacuation pumps each have a getter material, one of the evacuation pumps has a rate of adsorbing the hydrogen gas which is higher than a rate of adsorbing the inert gas by one digit or more, and the other evacuation pump has a rate of adsorbing the hydrogen gas which is lower than the rate of adsorbing the inert, gas by one digit or more.

9. An ion beam apparatus comprising: a vacuum chamber; a gas field ion source that is installed in the vacuum chamber and has an emitter an extraction electrode that is disposed to face the emitter tip; gas supply means for supplying a gas to the emitter tip; a focusing lens that focuses an ion beam emitted from the emitter tip; a deflector that deflects the ion beam that has passed through the focusing lens; and a secondary particle detector that irradiates a sample with the ion beam to detect secondary particles emitted from the sample,
wherein the gas supply means includes a mixed gas chamber that contains a hydrogen gas and an inert gas or a nitrogen gas which causes concentration of the hydrogen gas to be equal to or lower than about 4% volume ratio of the hydrogen gas to a total volume of gas in the mixed gas chamber, a hydrogen gas adsorbing material containing chamber that adsorbs the hydrogen gas, and a hydrogen gas pipe that supplies the hydrogen gas to the vicinity of the emitter tip.

10. The ion beam apparatus according to claim 9, further comprising an inert gas pipe or a nitrogen gas pipe which supplies an inert gas or a nitrogen gas to the vicinity of the emitter tip, separately from the hydrogen gas pipe.

11. The ion beam apparatus according to claim 9, wherein a hydrogen gas purifier that reduces impurity gas concentration different from the hydrogen gas is installed in the hydrogen gas pipe.

12. The ion beam apparatus according to claim 9, wherein a hydrogen selective transmission membrane is installed in the hydrogen gas pipe.

13. The ion beam apparatus according to claim 9, wherein the gas supply means has two types of gas systems, each of the gas systems includes a heating mechanism and an exhaust path installed in a gas supply path, each of the exhaust paths is connected to a vacuum pump, and a valve that separates the respective exhaust paths from each other is provided.

* * * * *